United States Patent [19]
Okubo et al.

[11] Patent Number: 5,287,069
[45] Date of Patent: Feb. 15, 1994

[54] CONSTANT-AMPLITUDE WAVE COMBINATION TYPE AMPLIFIER

[75] Inventors: Naofumi Okubo, Kawasaki; Yoshihiko Asano; Hiroshi Kurihara, both of Tokyo; Yoshimasa Daido, Yokohama; Kazuhiko Kobayashi, Kawasaki; Shuji Kobayakawa, Yokohama; Toru Maniwa, Kawasaki, all of Japan

[73] Assignee: Fujitsu Limited, Kawasaki, Japan

[21] Appl. No.: 969,522

[22] Filed: Oct. 30, 1992

Related U.S. Application Data

[63] Continuation of Ser. No. 652,415, Feb. 7, 1991, abandoned.

[30] Foreign Application Priority Data

| Feb. 7, 1990 [JP] | Japan | 2-27698 |
| Feb. 7, 1990 [JP] | Japan | 2-27699 |
| Feb. 7, 1990 [JP] | Japan | 2-27700 |

[51] Int. Cl.⁵ ............................. H03F 3/38; H03F 3/68
[52] U.S. Cl. ...................................... 330/10; 332/84; 332/124 R; 332/149
[58] Field of Search ............... 330/10, 84, 149, 124 R, 330/295

[56] References Cited

U.S. PATENT DOCUMENTS

| 3,693,109 | 9/1972 | Swerdlow | 330/149 X |
| 3,909,742 | 9/1975 | Cox et al. | 330/84 |
| 4,178,557 | 12/1979 | Henry | 330/10 |
| 4,420,723 | 12/1983 | De Jager | 330/10 |
| 4,433,312 | 2/1984 | Kahn | 332/145 |
| 4,490,684 | 12/1984 | Epsom et al. | 330/124 R |
| 4,656,434 | 4/1987 | Selin | 330/84 |

FOREIGN PATENT DOCUMENTS

| 1-284106 | 11/1989 | Japan . |
| 2-87708 | 3/1990 | Japan . |
| 2010039A | 12/1978 | United Kingdom . |

OTHER PUBLICATIONS

D. C. Cox, "Linear Amplification with Nonlinear Components", IEEE Transactions on Communications, Dec. 1974, pp. 1942–1945.

*Primary Examiner*—James B. Mullins
*Attorney, Agent, or Firm*—Staas & Halsey

[57] ABSTRACT

A constant-amplitude wave combination type amplifier includes a first amplifier outputting a first amplified output, and a second amplifier outputting a second amplified output. The constant-amplitude wave combination type amplifier also includes a first constant-amplitude wave generating circuit for combining an input wave and the second amplified output from the second amplifier and for generating a first constant-amplitude wave which is input to the first amplifier, and a second constant-amplitude wave generating circuit for combining the input wave and the first amplified output from the first amplifier and for generating a second constant-amplitude wave. Further, the constant-amplitude wave combination type amplifier includes a wave combining circuit for combining the first and second constant-amplitude waves and for generating an output wave.

44 Claims, 26 Drawing Sheets

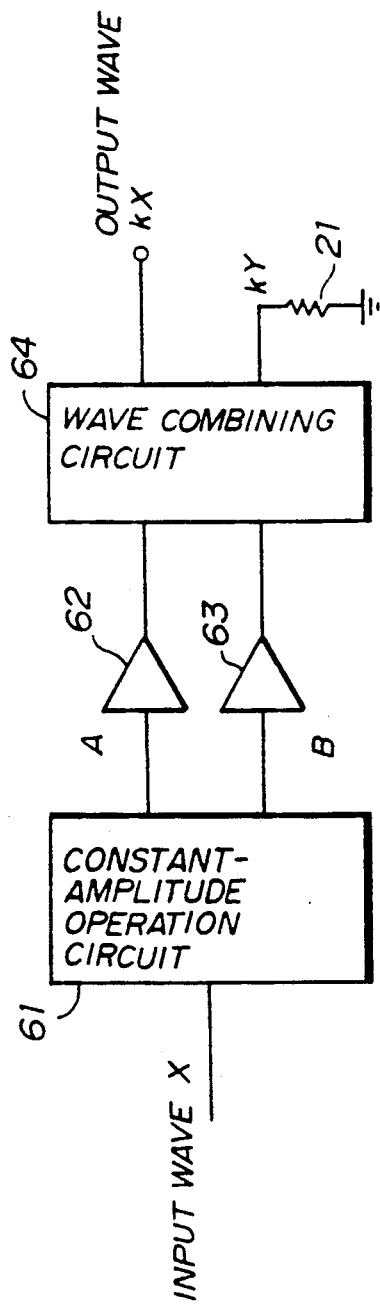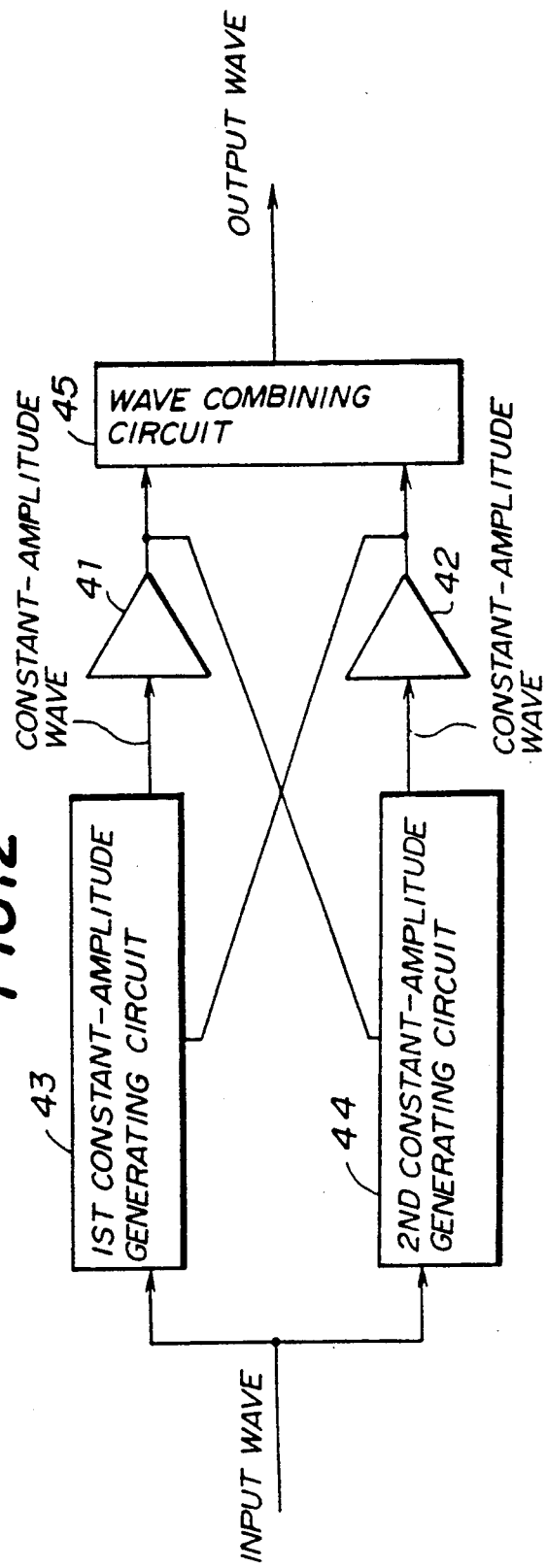

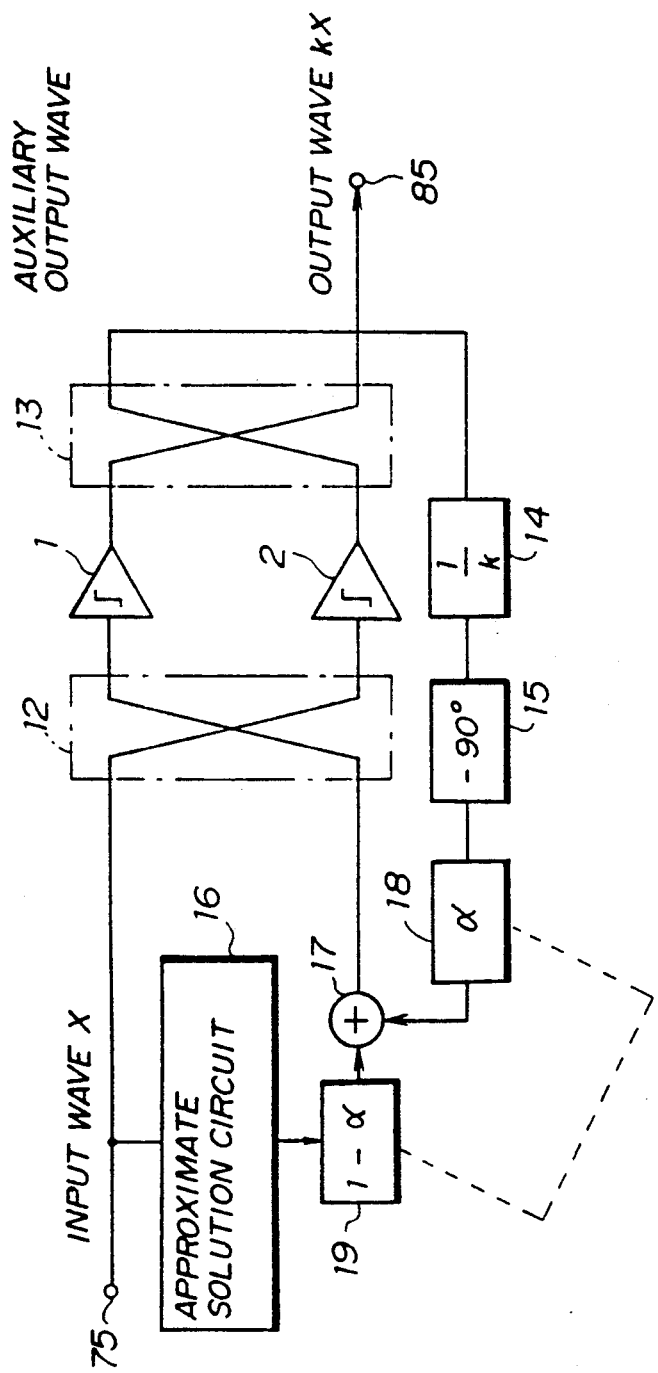

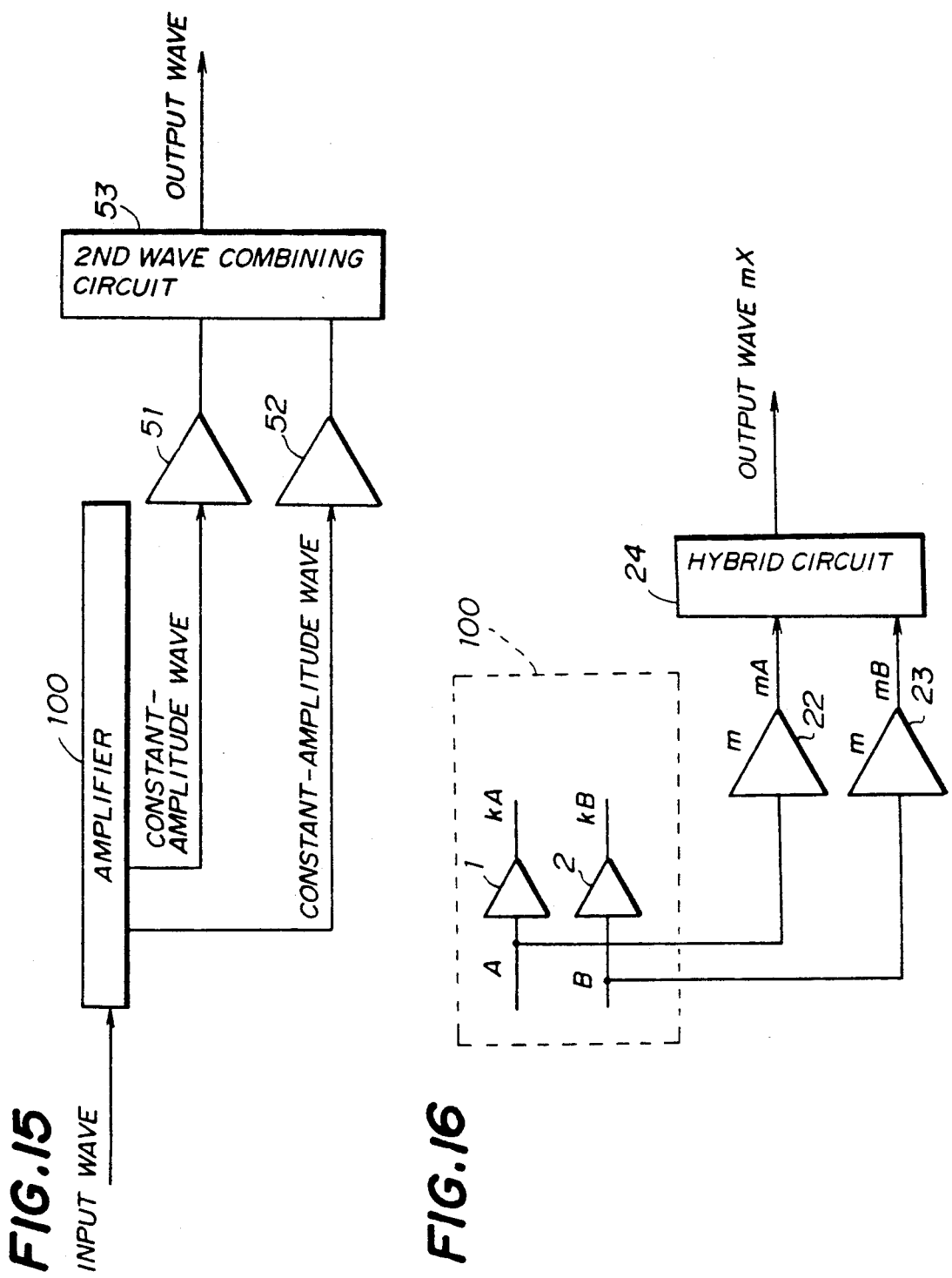

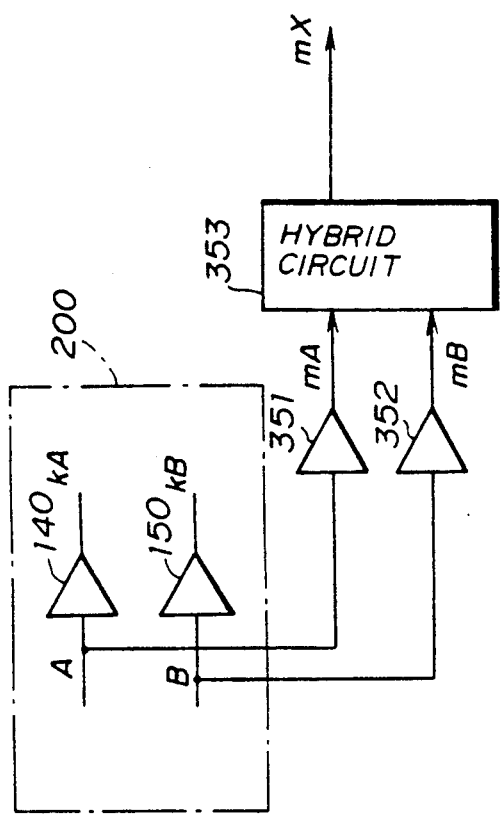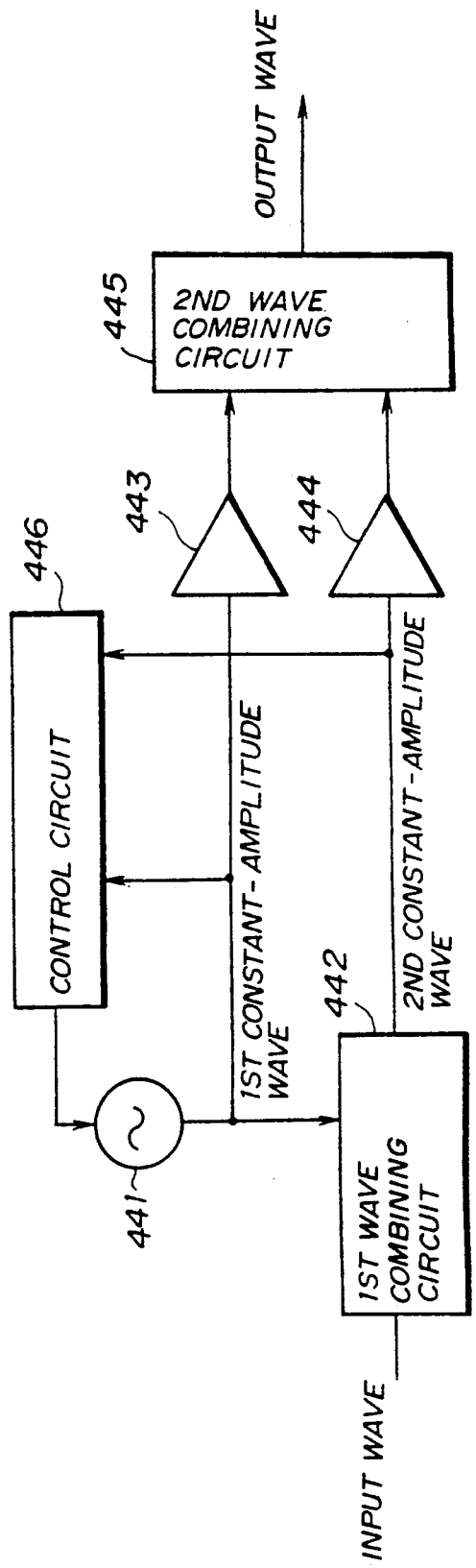

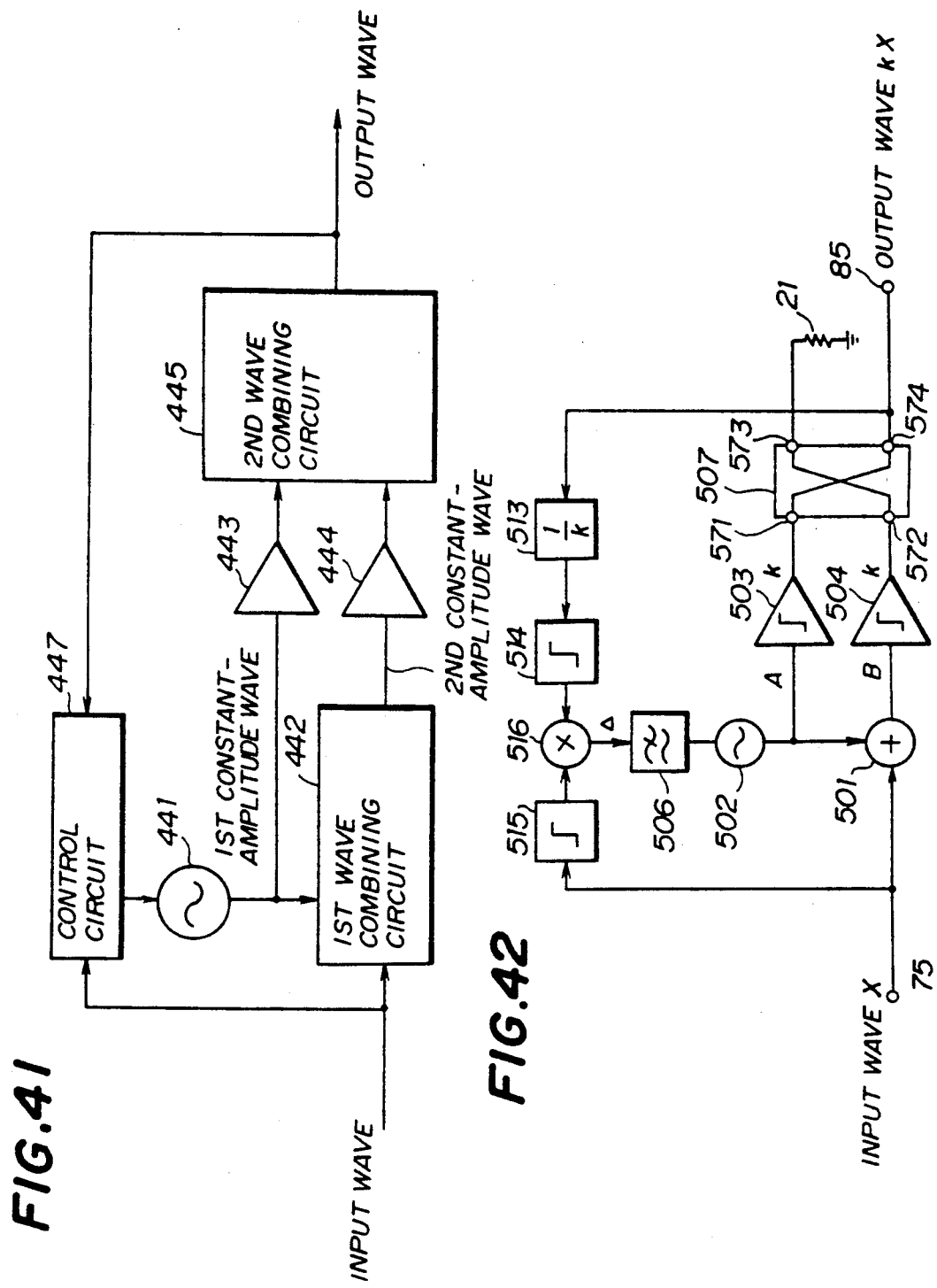

CONSTANT-AMPLITUDE WAVE COMBINATION TYPE AMPLIFIER

This application is a continuation, of application Ser. No. 07/652,415, filed Feb. 7, 1991, now abandoned.

BACKGROUND OF THE INVENTION

The present invention generally relates to a constant-amplitude wave combination type amplifier, and more particularly to a constant-amplitude wave combination type amplifier based on an LINC (linear amplification with non-linear components) process.

Recently, constant-amplitude wave combination type amplifiers have been widely used in various communication devices, such as radio devices for use in mobile communications, multiple radio devices, satellite communication radio devices, and broadcasting devices. There is a need to realize such constant-amplitude wave combination amplifiers which consume a small amount of power and which are configured of a small number of structural elements.

Constant-amplitude wave combination type amplifiers based on the LINC process are known as amplifiers which meet the above-mentioned need, and are disclosed in, for example, D. C. Cox, "Linear Amplification with Non-linear Components", IEEE Transactions on Communications, December 1974, pp. 1942-1945. An application of constant-amplitude wave combination type amplifiers based on the LINC process is proposed in Japanese Laid-Open Patent Application No. 1-284106.

FIG. 1 shows a conventional constant-amplitude wave combination type amplifier. As shown, the amplifier has a constant-amplitude wave operation circuit 61, two amplifiers 62 and 63, and a wave combining circuit 64. The constant-amplitude wave operation circuit 61 is formed of a digital signal processing circuit, and calculates an orthogonal wave Y orthogonal to an input wave X so that each combined wave obtained by combining the waves X and Y with each other has a constant amplitude. Then, the constant-amplitude wave operation circuit 61 outputs constant-amplitude waves A and B which have constant envelopes having equal amplitudes by the above-mentioned combination of the waves X and Y. Capital letters X, Y, A and B are vector amounts which include phases.

The amplifiers 62 and 63, which are formed of non-linear amplifiers such as C-class amplifiers, amplify the constant-amplitude waves A and B, respectively. The wave combining circuit 64 combines constant amplitude waves kA and kB respectively output by the amplifiers 62 and 63, and generates an output wave kX which is an amplified version of the input wave X.

The conventional configuration shown in FIG. 1 has an advantage in that the amplifiers 62 and 63 are not required to be formed of linear amplifiers, since it is sufficient to amplify the constant-amplitude waves A and B of the constant envelopes. In addition, since the original signal can be reproduced by the wave combining circuit 64, it is possible to linearly amplify the input wave X having little distortion irrespective of the use of the non-linear amplifiers.

As has been described previously, the constant-amplitude wave operation circuit 61 is formed of a digital signal processing circuit. However, the digital signal processing circuit consumes a large amount of power and is not suitable for high-speed signal processing. Further, the use of the digital signal processing circuit causes an increase in the size of the amplifier. For the above reasons, the use of conventional constant-amplitude wave combination type amplifiers is limited to special applications in which the amount of power consumed in the digital signal processing circuit or the size of the amplifier are negligible, or applications in which data is transferred at a low speed.

SUMMARY OF THE INVENTION

It is a general object of the present invention to provide an improved constant-amplitude wave combination type amplifier in which the above-mentioned disadvantages are eliminated.

A more specific object of the present invention is to provide a constant-amplitude wave combination type amplifier which consumes a small amount of power, is formed of a small number of structural elements and operates at a high speed.

The above-mentioned objects of the present invention are achieved by a constant-amplitude wave combination type amplifier comprising: a first amplifier outputting a first amplified output; a second amplifier outputting a second amplified output; first constant-amplitude wave generating means, coupled to the first and second amplifiers, for combining an input wave and the second amplified output from the second amplifier and for generating a first constant-amplitude wave which is input to the first amplifier; second constant-amplitude wave generating means, coupled to the first and second amplifiers, for combining the input wave and the first amplified output from the first amplifier and for generating a second constant-amplitude wave; and first wave combining means, coupled to the first and second amplifiers, for combining the first and second constant-amplitude waves and for generating an output wave.

The aforementioned objects of the present invention are also achieved by a constant-amplitude wave combination type amplifier comprising: constant-amplitude wave generating means for combining an input wave and a first auxiliary input wave and for generating a first constant-amplitude wave and a second constant-amplitude wave; a first amplifier amplifying the first constant-amplitude wave and outputting a first amplified output; a second amplifier amplifying the second constant-amplitude wave and outputting a second amplified output; first wave combining means, coupled to the first and second amplifiers, for combining the first and second amplified outputs and for generating an output wave and an auxiliary output wave; and auxiliary wave feedback means, coupled to the first wave combining means and the constant-amplitude wave generating means, for feeding back, as the first auxiliary input wave, the auxiliary output wave to the constant-amplitude wave generating means.

The aforementioned objects of the present invention are also achieved by a constant-amplitude wave combination type amplifier comprising: constant-amplitude wave generating means for combining an input wave and an auxiliary input wave and for generating a first constant-amplitude wave and a second constant-amplitude wave; a first amplifier amplifying the first constant-amplitude wave and outputting a first amplified output; a second amplifier amplifying the second constant-amplitude wave and outputting a second amplified output; first wave combining means, coupled to the first and second amplifiers, for combining the first and second amplified outputs and for generating an output wave and an auxiliary output wave; and auxiliary wave generating means, coupled to the constant-amplitude wave generating means, for generating the auxiliary input wave from the input wave.

The aforementioned objects of the present invention are also achieved by a constant-amplitude wave combination type amplifier comprising: variable frequency generating means for generating a first constant-amplitude wave having a frequency controllable by a control signal; first wave combining means, coupled to the variable frequency generating means, for combining an input wave and the first constant-amplitude wave and for generating a second constant-amplitude wave; a first amplifier which amplifies the first constant-amplitude wave and which generates a first amplified output; a second amplifier which amplifies the second constant-amplitude wave and which generates a second amplified output; second wave combining means, coupled to the first and said amplifiers, for combining the first and second amplified outputs and for generating an output wave; and first control means, coupled to the first combining means and the variable frequency generating means, for generating the control signal from the first and second constant-amplitude waves.

The aforementioned objects of the present invention are also achieved by a constant-amplitude wave combination type amplifier comprising: variable frequency generating means for generating a first constant-amplitude wave having a frequency controllable by a control signal; first wave combining means, coupled to the variable frequency generating means, for combining an input wave and the first constant-amplitude wave and for generating a second constant-amplitude wave; a first amplifier which amplifies the first constant-amplitude wave and which generates a first amplified output; a second amplifier which amplifies the second constant-amplitude wave and which generates a second amplified output; second wave combining means, coupled to the first and second amplifiers, for combining the first and second amplified outputs and for generating an output wave; and control means for generating the control signal from the input wave and the output wave.

BRIEF DESCRIPTION OF THE DRAWINGS

Other objects, features and advantages of the present invention will become more apparent from the following detailed description when read in conjunction with the accompanying drawings, in which:

FIG. 1 is a block diagram of a conventional constant-amplitude wave combination type amplifier;

FIG. 2 is a block diagram illustrating an outline of a constant-amplitude wave combination type amplifier according to a first preferred embodiment of the present invention;

FIG. 14 is a block diagram of a variation of the configuration shown in FIG. 11;

FIG. 15 is a block diagram illustrating an outline of a constant-amplitude wave combination type amplifier according to a fourth preferred embodiment of the present invention;

FIG. 16 is a block diagram illustrating the configuration shown in FIG. 15 in more detail;

FIG. 34 is a block diagram illustrating the configuration shown in FIG. 33 in more detail;

FIG. 35 is a block diagram illustrating an outline of a constant-amplitude wave combination type amplifier according to a twelfth preferred embodiment of the present invention;

FIG. 41 is a block diagram illustrating an outline of a constant-amplitude wave combination type amplifier according to a thirteenth preferred embodiment of the present invention;

FIG. 42 is a block diagram illustrating the configuration shown in FIG. 41 in more detail;

DESCRIPTION OF THE PREFERRED EMBODIMENTS

Figure 3:
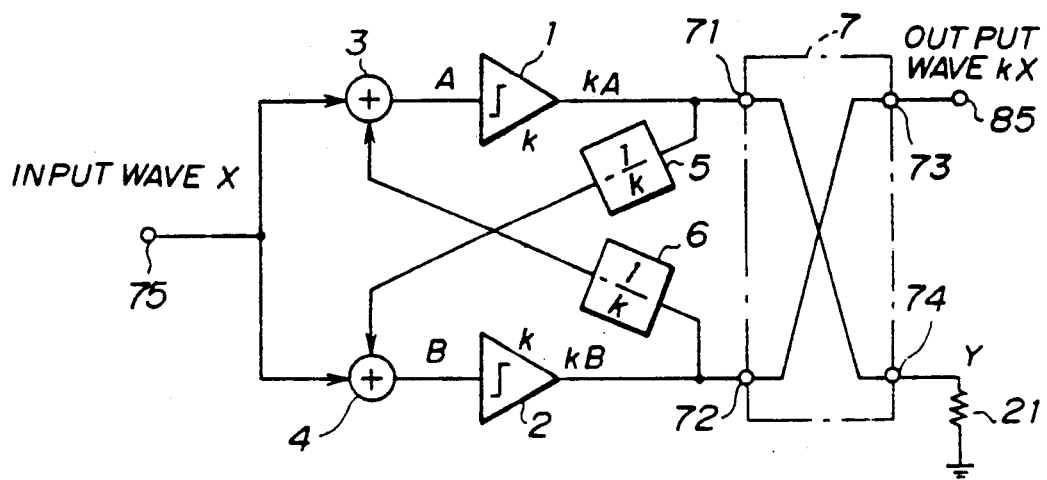
FIG. 3 is a block diagram illustrating the configuration shown in FIG. 2 in more detail.

FIG. 2 shows an outline of a constant-amplitude wave combination type amplifier according to a first preferred embodiment of the present invention. The amplifier shown in FIG. 2 has a first constant-amplitude wave generating circuit 43, a second constant-amplitude wave generating circuit 44, first and second amplifiers 41 and 42, and a wave combining circuit 45. The first constant-amplitude wave generating circuit 43 combines an amplified output from the second amplifier 42 and an input wave, and generates a first constant-amplitude wave. The second constant-amplitude wave generating circuit 44 combines an amplified output from the first amplifier 41 and the input wave, and generates a second constant-amplitude wave. The first and second amplifiers 41 and 42 amplify the first and second constant-amplitude waves output by the first and second constant-amplitude wave generating circuits 43 and 44, respectively. The wave combining circuit 45 combines the amplified outputs from the first and second amplifiers 41 and 42, and generates an output wave.

The amplified output from the first amplifier 41 is fed back to the input of the second amplifier 42 via the second constant-amplitude wave generating circuit 44. Similarly, the amplified output from the second amplifier 42 is fed back to the input of the first amplifier 41 via the first constant-amplitude wave generating circuit 43. Thus, the circuit shown in FIG. 2 is stable in an oscillation state. In the stable oscillation state, the first and second constant-amplitude waves respectively generated by the first and second constant-amplitude wave generating circuits 43 and 44 have envelopes having constant amplitudes. As a result, it becomes possible to form the first and second amplifiers 41 and 42 of high-efficient non-linear amplifiers. It is also possible to form the first and second constant-amplitude wave generating circuits 43 and 44 of analog circuits. As a result, the configuration shown in FIG. 2 consumes a small amount of power, operates at a high speed and can be formed of a small number of structural elements.

FIG. 3 shows the configuration of the amplifier shown in FIG. 2 in more detail. The configuration shown in FIG. 3 has amplifiers 1 and 2, which correspond to the first and second amplifiers 41 and 42 shown in FIG. 3, respectively. The amplifiers 1 and 2 are formed of amplifiers, each having an amplification gain 'k', and receive constant-amplitude waves A and B, respectively. The amplifiers 1 and 2 can be formed of high-efficient non-linear amplifiers, such as C-class amplifiers. An amplified output kA from the amplifier 1 is input to an attenuator 5 and an input terminal 71 of an in-phase hybrid circuit 7 corresponding to the wave combining circuit 45 shown in FIG. 2. An amplified output kB from the amplifier 2 is input to an attenuator 6 and an input terminal 72 of the in-phase hybrid circuit 7.

The attenuator 5 attenuates the amplified signal kA by $-1/k$. Similarly, the attenuator 6 attenuates the amplified signal kB by $-1/k$. An output signal of the attenuator 5 is input to an adder 4 corresponding to the first constant-amplitude wave generating circuit 43 shown in FIG. 2, and an output signal of the attenuator 6 is input to an adder 3 corresponding to the second constant-amplitude wave generating circuit 44 shown in FIG. 2. An input wave X is applied to the adders 3 and 4 via an input terminal 75. The adder 3 adds the input wave X and the amplified signal kB passing through the attenuator 6, and generates the constant-amplitude wave A, which is input to the amplifier 1. Similarly, the adder 4 adds the input wave X and the amplified signal kA passing through the attenuator 5, and generates the constant-amplitude wave B, which is input to the amplifier 2. It will be noted that the adders 3 and 4 and the hybrid circuit 4 can be formed of analog circuits.

The in-phase hybrid circuit 7 receives the amplified signals kA and kB via the input terminals 71 and 72, respectively, and branches each of the amplified signals kA and kB into two signals. Then, the in-phase hybrid circuit 7 outputs an output wave kX obtained by combining the constant-amplitude waves kA/2 and kB/2 with each other to an output terminal 73 and outputs an output wave Y to an output terminal 74 so that the output waves kX and Y are in phase with each other. The output wave kX is supplied to an external circuit via an output terminal 85. The output wave Y obtained at the output terminal 74 is terminated via a resistor 21. The input wave X and the wave Y are orthogonal to each other.

Figure 4:
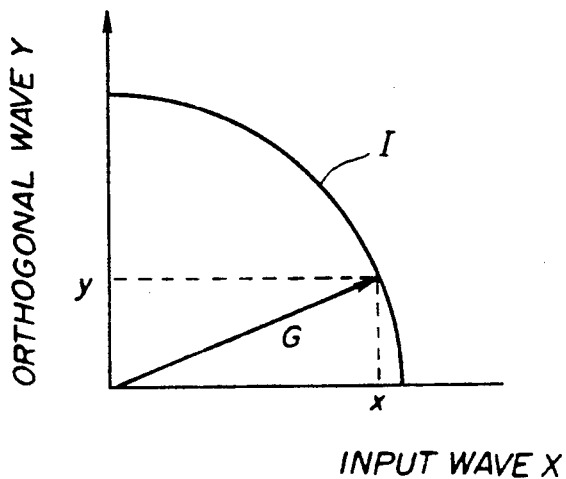
FIG. 4 is a graph illustrating the principle of the operation of the configuration shown in FIG. 3.

A description will now be given of the operation of the amplifier shown in FIG. 3 with reference to FIGS. 4 and 5. The orthogonal wave Y is assumed so that a combined vector wave obtained by combining the input wave X and the orthogonal wave Y has a constant amplitude. As shown in FIG. 4, when the combined vector wave (now labeled G) obtained by combining the waves X and Y has a constant amplitude, the vector locus of the combined vector wave G moves on a part of a circle illustrated by the solid line indicated by I.

As has been described previously, the amplified signals kA and kB are fed back to the amplifiers 2 and 1 via the attenuators 5 and 6, respectively. Thus, the circuit shown in FIG. 3 starts to oscillate and become stable in an oscillation state.

Figure 5:
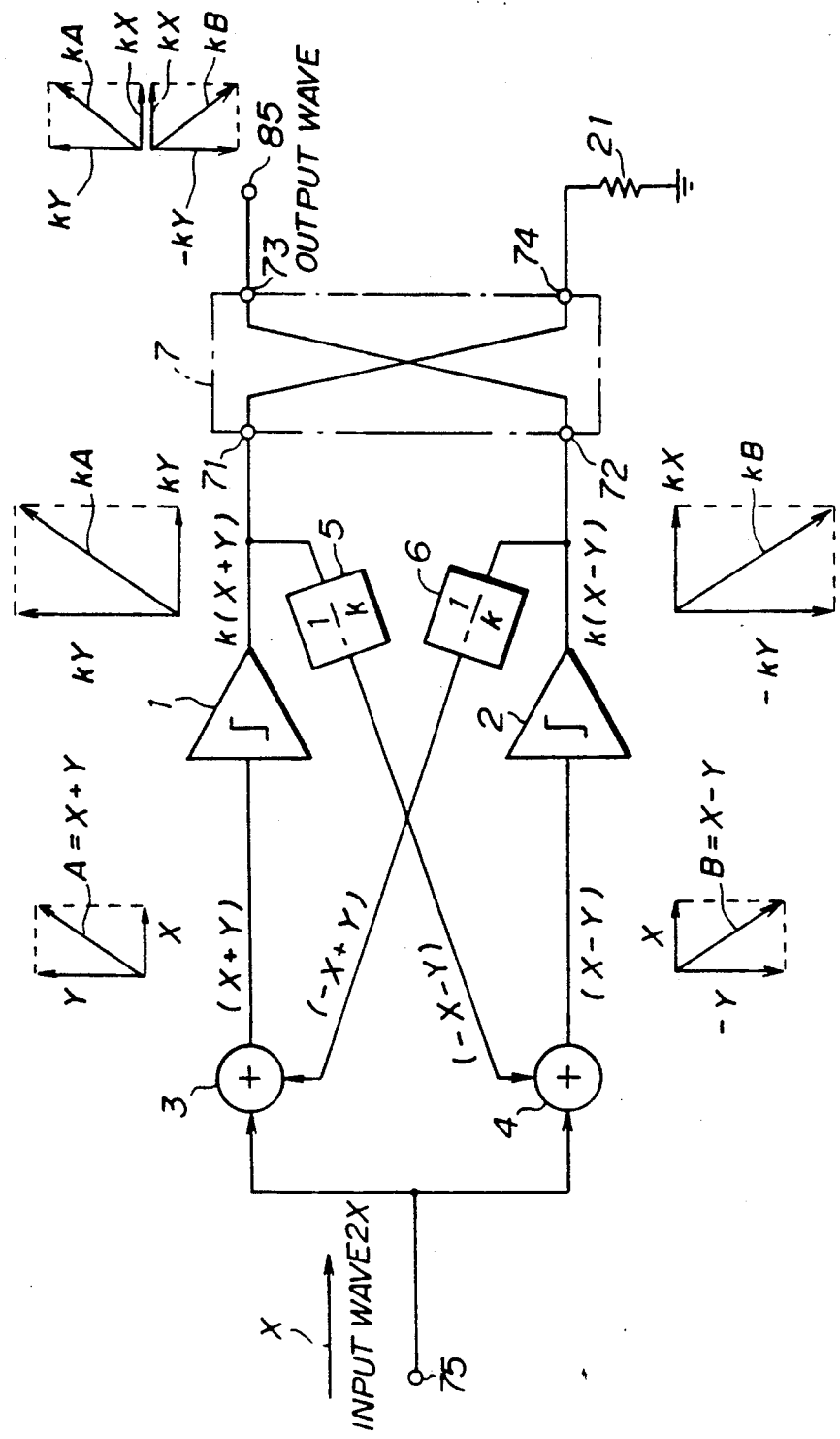
FIG. 5 is a block diagram illustrating the operation of the configuration shown in FIG. 3.

FIG. 5 shows the amplitudes of signals which are obtained at nodes of the circuit shown in FIG. 3 in a case where the input waveform has an amplitude 2 X and which are represented by the assumed orthogonal wave Y. As shown in FIG. 5, the output of the adder 3 is (X+Y), the output of the amplifier 1 is k(X+Y), the output of the adder 4 is (X−Y), the output of the attenuator 5 is (−X−Y), the output of the attenuator 6 is (−X+Y), and the output of the in-phase hybrid circuit 7 at its output terminal 73 is 2 kX. In the above states, the circuit shown in FIG. 3 stably oscillates. FIG. 5 also illustrates the phase relationships between the signals at the nodes of the amplifier.

In the stable oscillation state, the output of the adder 3 is the combined vector wave obtained by combining the input wave X and the orthogonal wave Y orthogonal to the input wave X, and the combined vector wave is the constant-amplitude wave A (=X+Y) having the constant amplitude, as has been described with reference to FIG. 4. Similarly, the output of the adder 4 is the combined vector wave obtained by combining the input wave X and the orthogonal wave −Y, and the combined vector wave is the constant-amplitude wave B (=X−Y) having the constant amplitude. Thus, the signals input to the amplifiers 1 and 2 have the respective constant-amplitude waves A and B in which the envelopes thereof have the constant amplitudes. As a result, it is not necessary to form the amplifiers 1 and 2 of the linear amplifiers. In other words, the amplifiers 1 and 2 can be formed of high-efficiency non-linear analog amplifiers, such as C-class amplifiers.

The amplified outputs kA and kB respectively generated by the amplifiers 1 and 2 are combined by the in-phase hybrid circuit 7. In this case, the components of the orthogonal wave Y are mutually canceled at the output terminal 73, so that the output wave 2 kX which are the signal components of the input wave are obtained at the output terminal 73.

Figure 6:
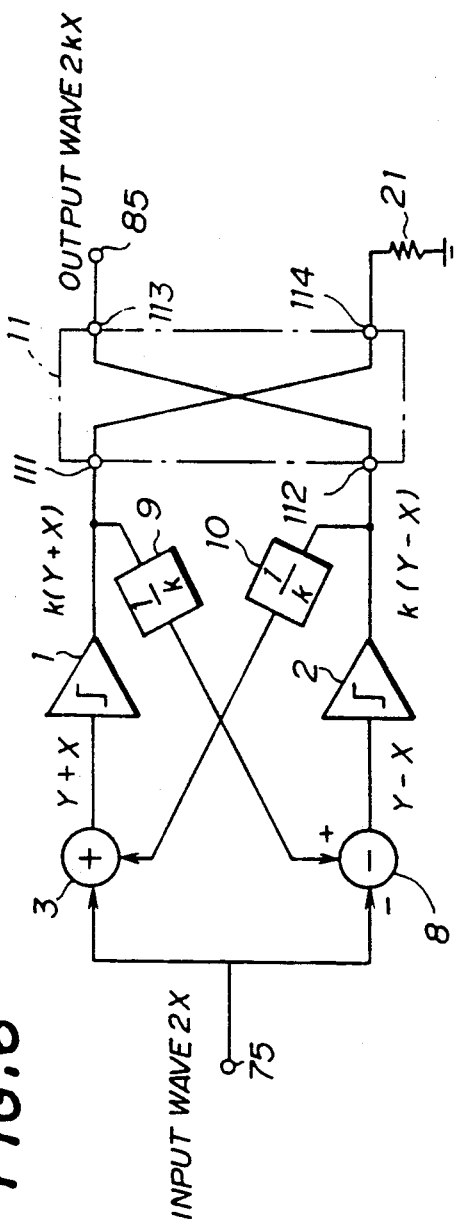
FIG. 6 is a block diagram illustrating a variation of the configuration shown in FIG. 3.

FIG. 6 illustrates a variation of the amplifier shown in FIG. 3. In FIG. 6, those parts which are the same as those shown in the previous figures are given the same reference numerals. The variation shown in FIG. 6 is different from the amplifier shown in FIG. 3 in that the amplified output from the amplifier 1 is fed back to the input of the amplifier 2 via an attenuator 9 having an attenuation level 1/k and a subtracter 8, and the amplified output from the amplifier 2 is fed back to the input of the amplifier 1 via an attenuator 10 having an attenuation level 1/k and the adder 3. Further, the amplified outputs from the amplifiers 1 and 2 are input to input terminals 111 and 112, respectively, of a 180° out-of-phase hybrid circuit 11.

In the stable oscillation state, the output of the adder 3 is (Y+X), the output of the adder 8 is (Y−X) (that is, −B), the output of the amplifier 1 is k(Y+X), the output of the amplifier 2 is k(Y−X), and an output obtained at an output terminal 113 of the 180° out-of-phase hybrid circuit 11 is 2 kX. Thus, the output signals from the adder 3 and the subtracter 4 have constant envelopes having equal amplitudes, so that the amplifiers 1 and 2 can be formed of non-linear analog amplifiers.

Figure 7:
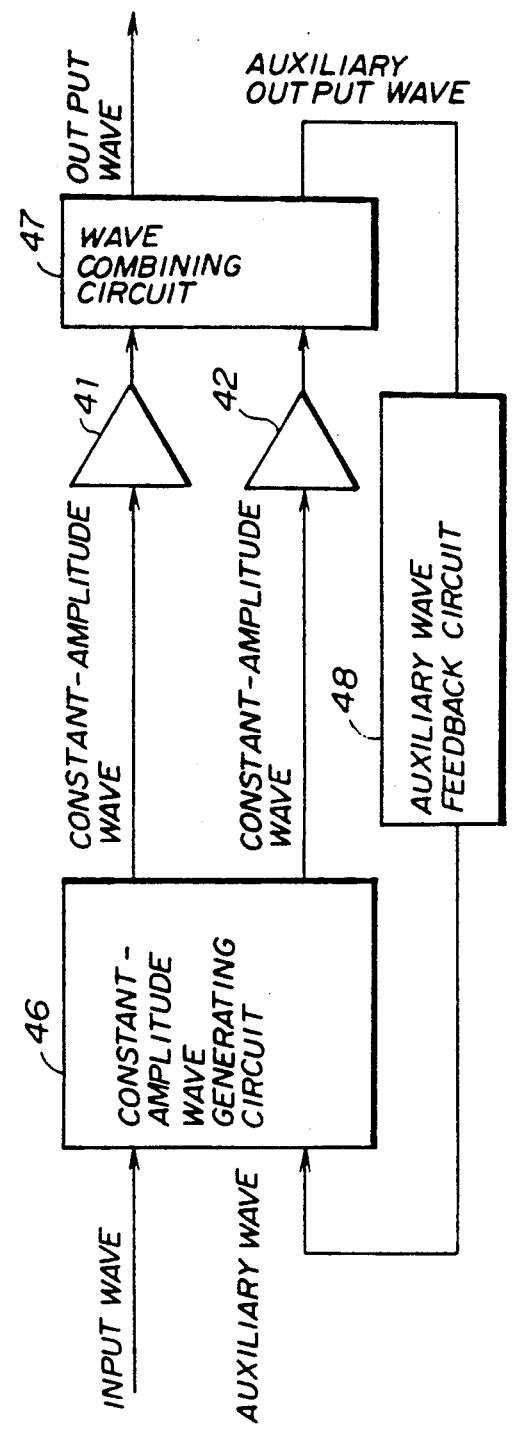
FIG. 7 is a block diagram illustrating an outline of a constant-amplitude wave combination type amplifier according to a second preferred embodiment of the present invention.

A description will now be given of a constant-amplitude wave combination type amplifier according to a second preferred embodiment of the present invention. FIG. 7 shows an outline of the second preferred embodiment of the present invention, in which those parts which are the same as those shown in the previous figures are given the same reference numerals. The amplifier shown in FIG. 7 has a constant-amplitude wave generating circuit 46, two amplifiers 41 and 42, a wave combining circuit 47 and an auxiliary wave feedback circuit 48. The constant-amplitude wave generating circuit 46, which is formed of an analog circuit, combines an input wave and an auxiliary signal (also referred to as an auxiliary input signal) from the auxiliary wave feedback circuit 48, and generates two constant-amplitude waves having constant envelopes having equal amplitudes. The wave combining circuit 47 combines the outputs of the amplifiers 41 and 42, and generates an output wave and an auxiliary output wave. The auxiliary output wave is fed back to the input of the constant-amplitude wave generating circuit 46 via the auxiliary wave feedback circuit 48. It will be noted that a closed-loop circuit related to the auxiliary output wave is formed, this closed-loop circuit causing the circuit to oscillate. The outputs of the constant-amplitude wave generating circuit 46 are constant-amplitude waves when the circuit is stable in the oscillation state.

Figure 8:
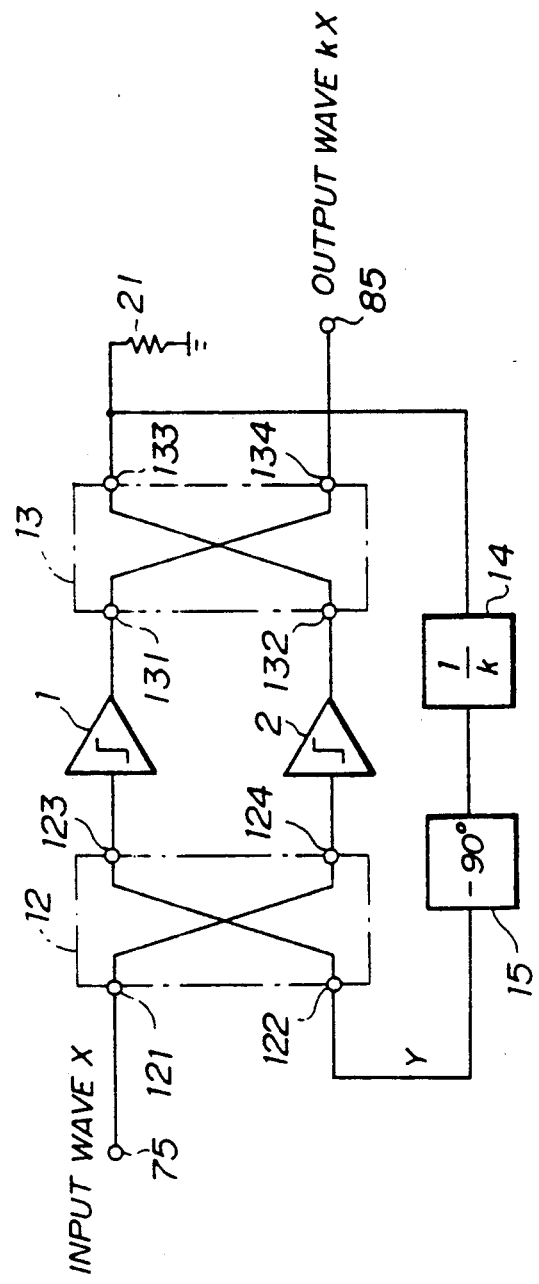
FIG. 8 is a block diagram illustrating the configuration shown in FIG. 7 in more detail.

FIG. 8 illustrates the configuration shown in FIG. 7 in more detail. The configuration shown in FIG. 8 has a 90° hybrid circuit 12 corresponding to the constant-amplitude wave generating circuit 46 (FIG. 7), a 90° hybrid circuit 13 corresponding to the wave combining circuit 47, an attenuator 14 having an attenuation level 1/k, and a −90° phase shifter 15. The combination of the attenuator 14 and the 90° phase shifter 15 corresponds to the auxiliary wave feedback circuit 48 shown in FIG. 7.

The input wave X is input to an input terminal 121 of the 90° hybrid circuit 12, and an auxiliary wave labeled Y is input, as a feedback signal, to an input terminal 122 of the 90° hybrid circuit 12. Output signals obtained at output terminals 123 and 124 of the 90° hybrid circuit 12 are respectively supplied to input terminals 131 and 132 of the 90° hybrid circuit 13 via the amplifiers 1 and 2, respectively. An output signal obtained at an output terminal 133 of the 90° hybrid circuit 13 is terminated via the terminating resistor 21, and fed back to the input terminal 122 of the −90° hybrid circuit via the attenuator 14 and the −90° phase shifter 15 connected in series. On the other hand, an output wave xK which is an amplified version of the input wave X is obtained at an output terminal 134 of the 90° hybrid circuit 13 connected to the output terminal 85.

The 90° hybrid circuit 12 branches each of the waves applied to the input terminals 121 and 122 thereof into two signals, and outputs in-phase components to identical direction terminals (terminals 123 and 124 With respect to the terminals 121 and 122, respectively), and 90°-phase-shifted components to cross-direction output terminals (terminals 124 and 123 with respect to the terminals 121 and 122, respectively). At each of the output terminals 123 and 124, the phase of one of the input signals input to the two input terminals 121 and 122 is shifted by 90°, and the other one of the input signals and the above phase shifted input signal are vector-combined. The 90° hybrid circuit 13 operates in the same way as the 90° hybrid circuit 12.

Figure 9:
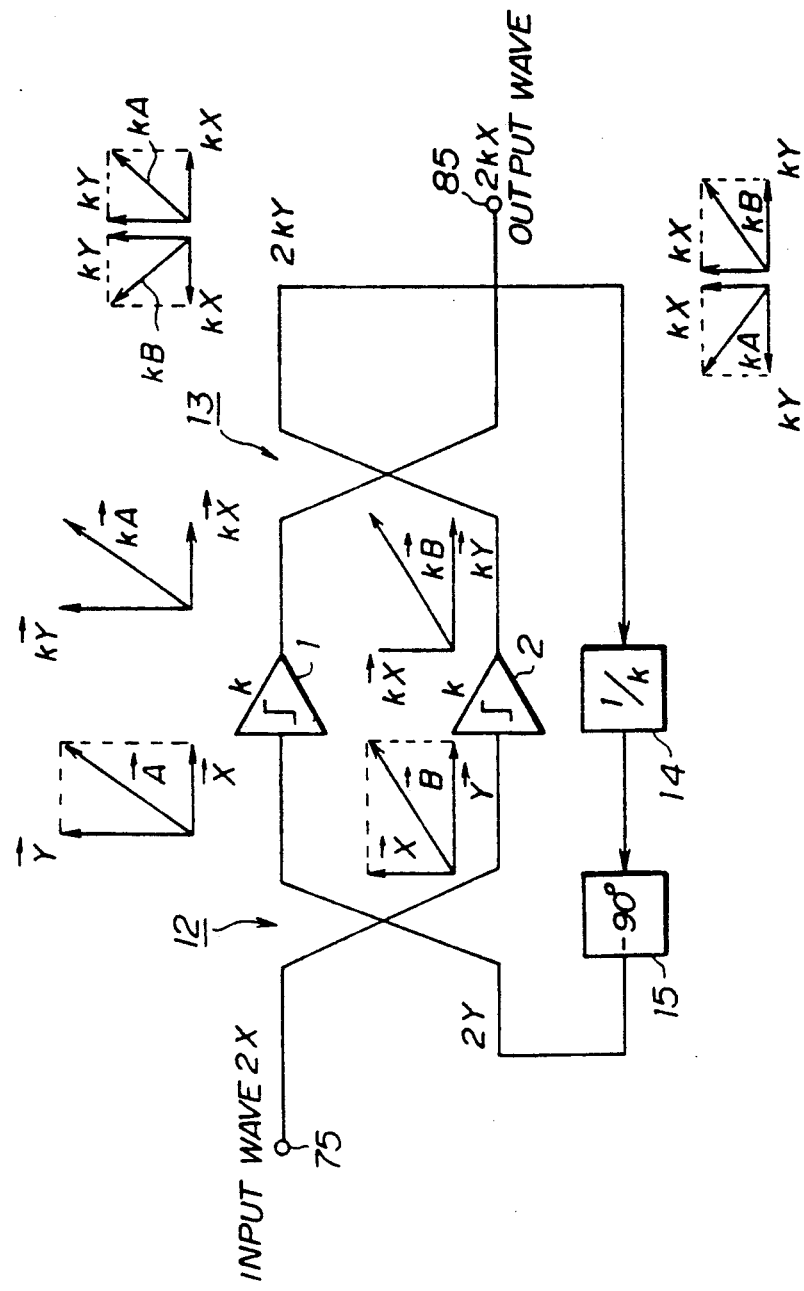
FIG. 9 is a block diagram illustrating the operation of the configuration shown in FIG. 8.

A description will now be given of the operation of the circuit shown in FIG. 8 with reference to FIG. 9, which shows the states of signals obtained at nodes by using vectors. The output signal obtained at the output terminal 133 of the 90° hybrid circuit 13 is fed back, as the auxiliary wave, to the input terminal 122 of the 90° hybrid circuit 12 via the attenuator 14 and the 90° phase shifter 15, so that the circuit can stably oscillate. It will be noted that the gain of the feedback circuit which carries the auxiliary wave is equal to 1 when the circuit stably oscillates.

It is assumed that the input signal having an amplitude 2 X is input to the input terminal of the 90° hybrid circuit 12. On the other hand, an output wave 2 kY obtained at the output terminal 133 of the 90° hybrid circuit 13 passes through the attenuator 14 and the −90° phase shifter 15, so that an auxiliary wave 2 Y is fed back to the input terminal 122 of the 90° hybrid circuit 12. Since the phase of the output wave 2 Y is shifted by −90° in the −90° phase shifter 15, the auxiliary wave 2 Y is in phase with the input wave 2 X. At the output terminal 123 of the 90° hybrid circuit 12, the input wave X and the auxiliary wave Y which has been phase-shifted by 90° are vector-combined, so that the constant-amplitude wave A is generated. At the output terminal 124 of the 90° hybrid circuit 12, a wave obtained by shifting the phase of the input wave X by 90° and the auxiliary wave Y are combined, so that the constant-amplitude wave B is generated. The constant-amplitude waves A and B have constant envelopes having equal amplitudes.

The constant-amplitude waves A and B are amplified by the amplifiers 1 and 2, respectively, so that amplified outputs kA and kB are applied to the input terminals 131 and 132 of the 90° hybrid circuit 13, respectively. The 90° hybrid circuit 13 combines the amplified outputs kA and kB. More specifically, at the output terminal 133, a wave kA/2 and a wave kB/2 which has been phase-shifted by 90° are combined, so that signal components of the input wave X are mutually canceled and signal components of the auxiliary wave Y are extracted as the auxiliary output wave 2 kY. At the output terminal 134 of the 90° hybrid circuit 13, a wave kA/2 which has been phase-shifted by 90° is combined with the wave kB/2, so that the signal components of the auxiliary output wave Y are mutually canceled. As a result, the amplifiers 1 and 2 can be formed of analog circuits, so that the amplifier shown in FIG. 8 can be formed of a small number of structural elements, consume a small amount of power, and operate at a high speed.

Figure 10:
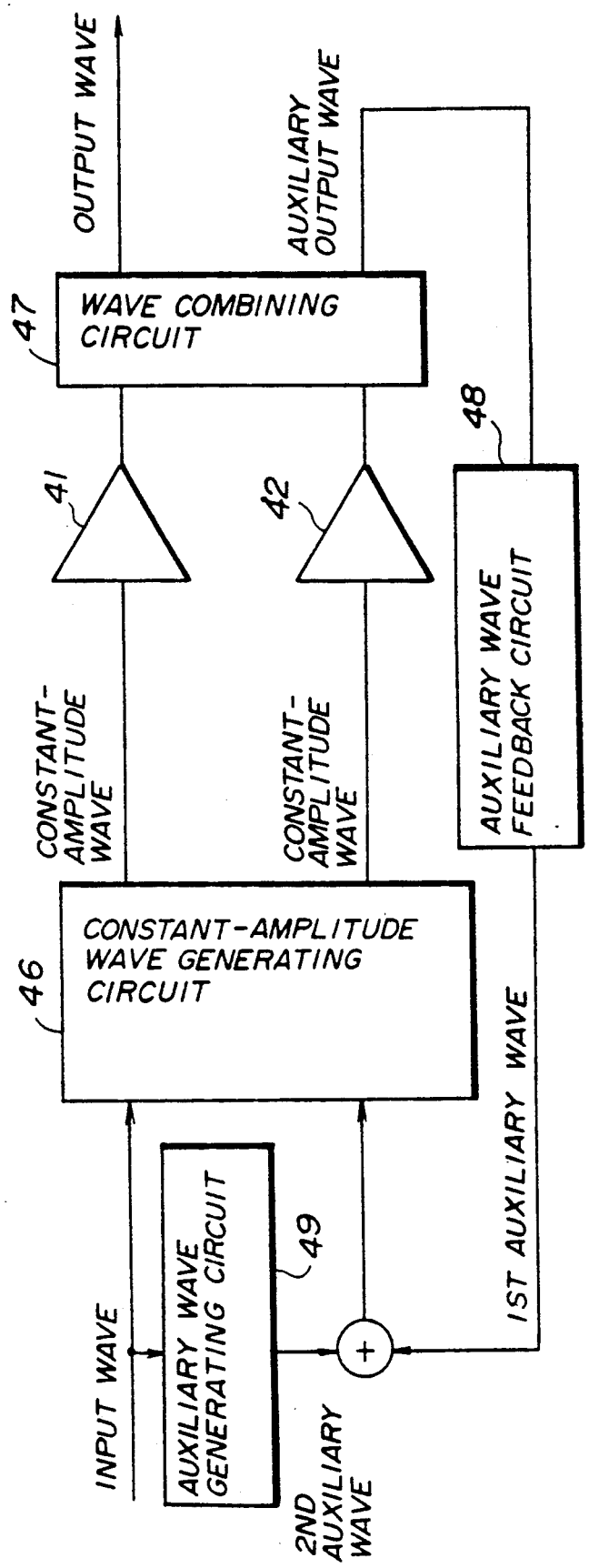
FIG. 10 is a block diagram illustrating an outline of a constant-amplitude wave combination type amplifier according to a third preferred embodiment of the present invention.

A description will now be given of a constant-amplitude wave combination type amplifier according to a third preferred embodiment of the present invention. Referring to FIG. 10, there is illustrated an outline of the third preferred embodiment of the present invention. In FIG. 10, those parts which are the same as those shown in the previous figures are given the same reference numerals. The configuration shown in FIG. 10 is obtained by adding an auxiliary wave generating circuit 49 and an adder 17 to the configuration shown in FIG. 7. The auxiliary wave generating circuit 49 generates a second auxiliary wave from the input wave. Hereafter, the auxiliary wave from the auxiliary wave feedback circuit 48 is referred to as the first auxiliary wave. The adder 17 adds the first and second auxiliary waves, and outputs an added wave to the constant-amplitude generating circuit 46.

More specifically, the auxiliary wave generating circuit 49 generates the second auxiliary wave when the amplitude of the input wave is small. With this arrangement, it becomes possible to prevent the amplifier shown in FIG. 7 from being in an unstable state when the amplitude of the input wave is small.

Figure 11:
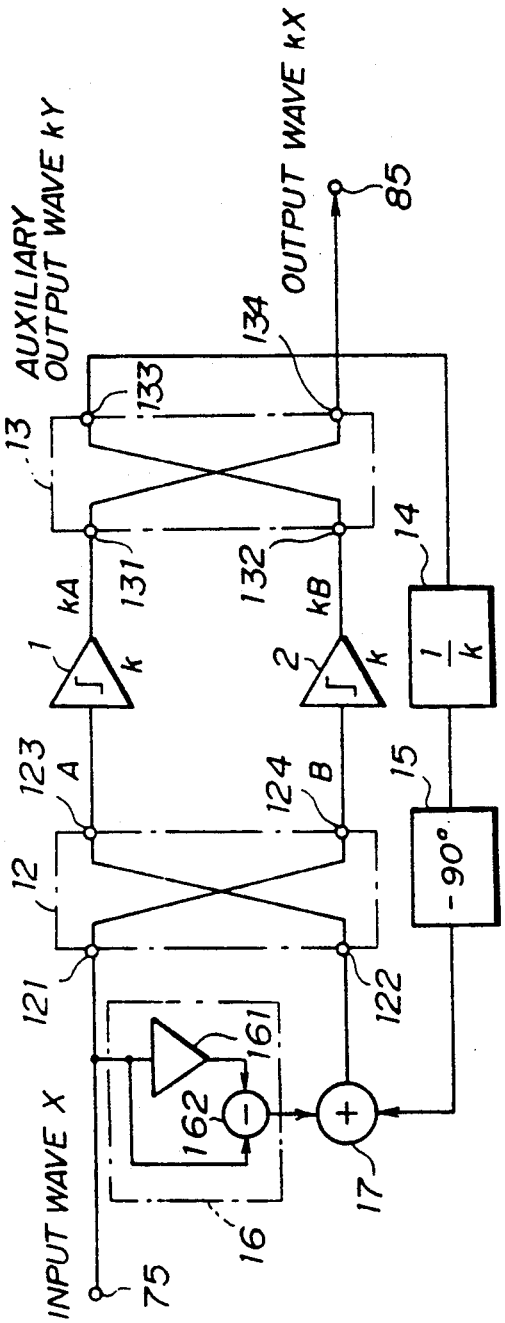
FIG. 11 is a block diagram illustrating the configuration shown in FIG. 10 in more detail.

FIG. 11 illustrates the configuration of the amplifier shown in FIG. 10 in more detail. In FIG. 11, those parts which are the same as those shown in the previous figures are given the same reference numerals. The auxiliary wave generating circuit 49 shown in FIG. 10 is formed of an analog approximate solution circuit 16, which is made up of a limiter amplifier 161 and a subtracter 162. The approximate solution circuit 16 outputs an approximate solution signal (which corresponds to the aforementioned second auxiliary wave) to the input terminal 122 of the 90° hybrid circuit 12 via the adder 17. The first auxiliary wave from the auxiliary wave feedback circuit 48 is also input to the input terminal 122 via the adder 17.

The input wave X passes through the limiter amplifier 161 and is input to the subtracter 162, which carries out a subtraction operation on the input wave X and the output wave from the limiter amplifier 161 and outputs an approximate solution of the amplitude of the orthogonal wave Y.

Figure 13:
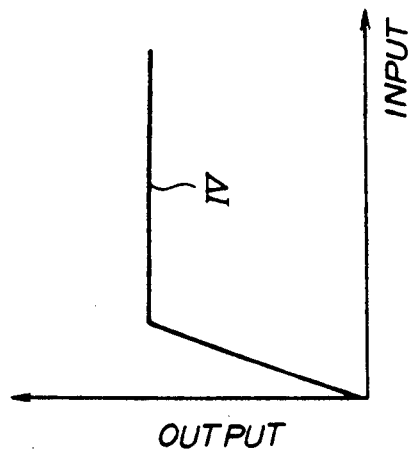
FIG. 13 is a graph illustrating an input/output characteristic of a limiter amplifier used in the approximate solution circuit shown in FIG. 11.
Figure 12:
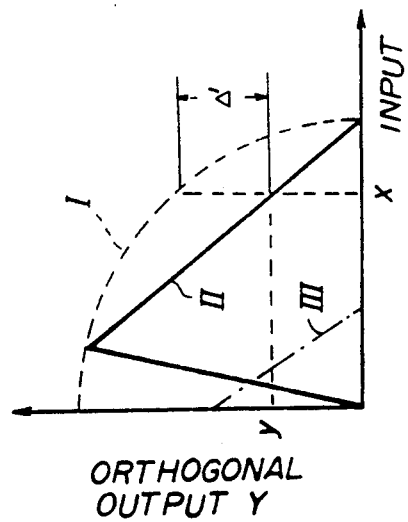
FIG. 12 is a graph of an input/output characteristic of an approximate solution circuit shown in FIG. 11.

As shown in FIG. 12, a characteristic II approximate to a circular characteristic I is realized by the analog approximate solution circuit 16, so that the orthogonal wave Y with respect to the input wave X is approximately generated. That is, the limiter amplifier 161 has an input/output characteristic IV, as shown in FIG. 13. Thus, when the output of the limiter amplifier 161 is subtracted from the input wave X by the subtracter 162, the characteristic II shown in FIG. 12 is obtained. It will be noted that the approximate solution output generated by the approximate solution circuit 16 is in phase with the input wave X.

By using the approximate solution circuit 16, it becomes possible to generate the auxiliary wave Y which is to be applied to the input terminal 122 of the 90° hybrid circuit 12 when the input wave X is small. With this arrangement, the amplifier can operate stably.

FIG. 14 illustrates a variation of the configuration shown in FIG. 11. In FIG. 14, those parts which are the same as those shown in FIG. 11 are given the same numerals. The configuration shown in FIG. 14 is different from that shown in FIG. 11 in that the approximate solution output from the approximate solution circuit 16 is applied to the adder 17 via an attenuator 19 having an attenuation level $1-\alpha(\alpha \leq 1)$ and the first auxiliary wave fed back via the −90° attenuator 15 is applied to the adder 17 via an attenuator 18 having an attenuation level $\alpha$. The attenuator 18 attenuates the first auxiliary wave by the attenuation level $\alpha$, and the attenuator 19 attenuates the second auxiliary wave (approximate solution output) by the attenuation level $(1-\alpha)$. The coefficient $\alpha$ is determined based on the stable oscillating state, so that the circuit shown in FIG. 14 can operate more stably and a distortion of the output wave Y can be further reduced.

The second auxiliary wave generating circuit 49 shown in FIG. 10 is not limited to the above-mentioned approximate solution circuit 16. For example, it is possible to form the second auxiliary wave generating circuit 49 of a circuit which has an input/output characteristic III shown in FIG. 12. It should be noted that the second auxiliary wave should have a frequency equal to that of the input wave X.

A description will now be given of a constant-amplitude wave combination type amplifier according to a fourth preferred embodiment of the present invention with reference to FIG. 15. The amplifier shown in FIG. 15 is made up of a constant-amplitude wave combination type amplifier 100, two amplifiers 51 and 52, and a second wave combining circuit 53. The constant-amplitude combination type amplifier 100 is formed of any one of the aforementioned first, second and third preferred embodiments of the present invention.

FIG. 16 illustrates the configuration shown in FIG. 15 in more detail. Amplifiers 22 and 23 correspond to the amplifiers 51 and 52 shown in FIG. 15, respectively, and have equal amplification gains m. The amplifiers 22 and 23 receive the constant-amplitude waves A and B, and output amplified outputs mA and mB, respectively. Alternatively, the amplifiers 22 and 23 receive the constant-amplitude waves kA and kB. A hybrid circuit 24 corresponds to the second wave combining circuit 53, and outputs an output wave mX which is an amplified version of the input wave X. Since the configuration shown in FIG. 16 has the amplifiers 22 and 23 separately from the amplification circuits having the feedback loop. With this arrangement, it is possible to efficiently amplify the input wave X.

A description will now be given of a constant-amplitude wave combination type amplifier according to a fifth preferred embodiment of the present invention with reference to FIG. 17. The amplifier shown in FIG. 17 has an auxiliary wave generating circuit 181, a constant-amplitude wave generating circuit 182, two amplifiers 183 and 184, and a combination circuit 185. The auxiliary wave generating circuit 181 is formed of an analog circuit which approximately generates an auxiliary wave from an input wave. The auxiliary wave is combined with the input wave by the constant-amplitude wave generating circuit 182, so that constant-amplitude waves are generated and output by the circuit 182. The amplifiers 183 and 184 amplify the corresponding constant-amplitude signals from the constant-amplitude wave generating circuit 182, and output amplified waves to the wave combining circuit 185. The wave combining circuit 185 combines the amplified waves and generates an output wave which is an amplified version of the input wave.

The auxiliary wave generating circuit 181 approximately generates the auxiliary wave orthogonal to the input wave by an analog circuit so that a combined vector wave obtained by vector-combining the input wave and the auxiliary wave has a constant amplitude. The constant-amplitude waves, which are generated from the input wave and the auxiliary wave by the constant-amplitude wave generating circuit 182, have constant envelopes having equal amplitudes. It is required that the amplifiers 183 and 184 amplify the constant-amplitude waves, and thus they are highly efficient non-linear amplifiers.

Figure 17:
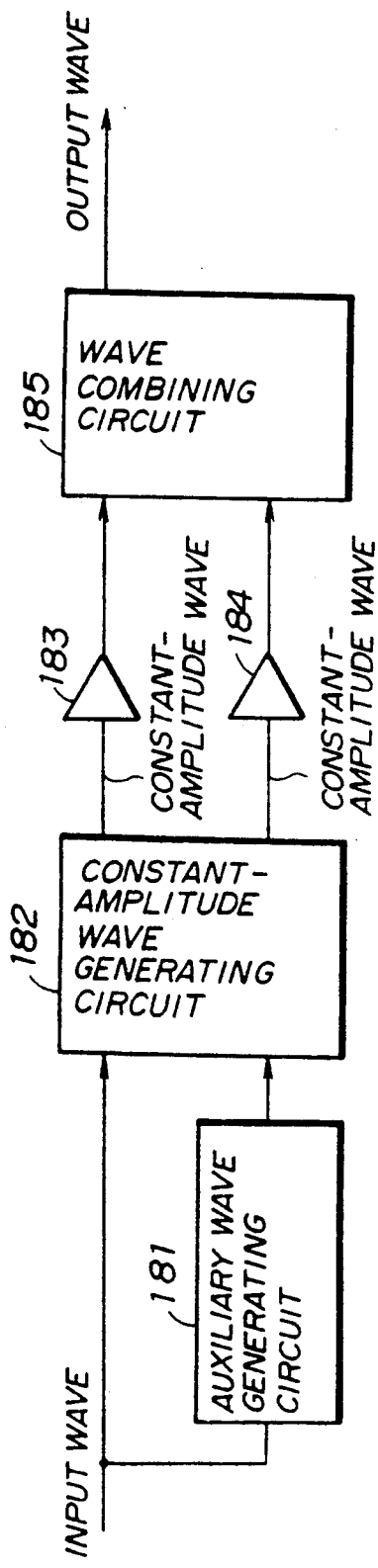
FIG. 17 is a block diagram illustrating an outline of a constant-amplitude wave combination type amplifier according to a fifth preferred embodiment of the present invention.
Figure 18:
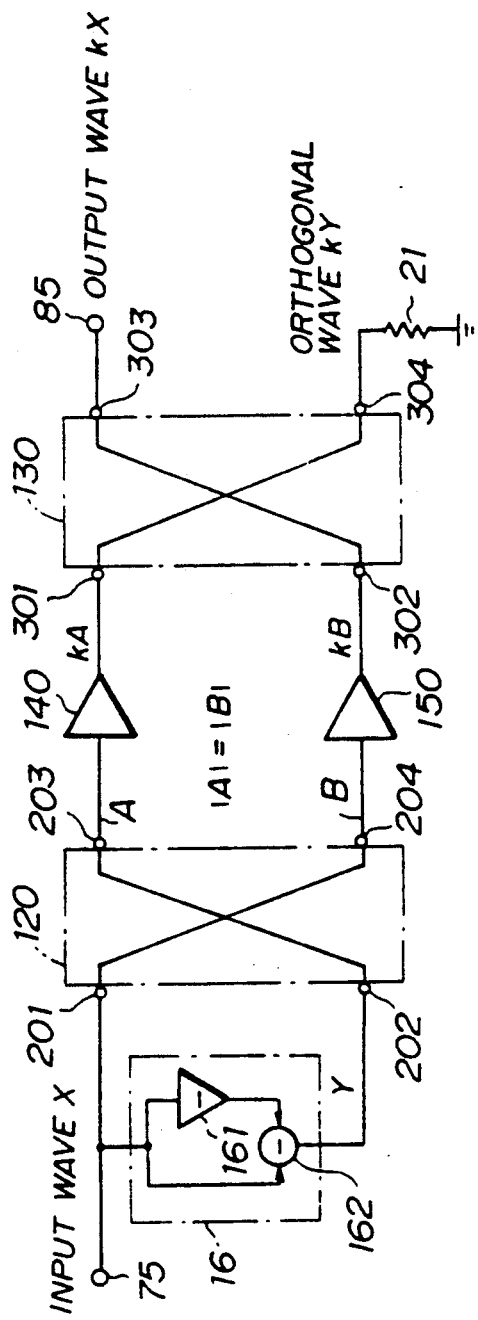
FIG. 18 is a block diagram illustrating the configuration shown in FIG. 17 in more detail.

FIG. 18 illustrates the configuration shown in FIG. 17 in more detail. The auxiliary wave generating circuit 181 is formed of the aforementioned approximate solution circuit 16 which is made up of the limiter amplifier 161 and the subtracter 162. As has been described previously, the approximate solution circuit 16 approximately generates the amplitude of the orthogonal wave Y so that the combined vector wave obtained by combining the input wave X applied to the input terminal 7 and the auxiliary wave has a constant amplitude. The approximate solution output has the characteristic II shown in FIG. 12. Since the auxiliary wave Y is in phase with the input wave X, a phase shifter means for rotating the phase of the auxiliary signal by 90° is provided at a following stage.

The auxiliary wave Y is input to an input terminal 202 of a 90° hybrid circuit 120 (which corresponds to the constant-amplitude wave generating circuit 182 shown in FIG. 17). The input wave X is input to an input terminal 201 of the 90° hybrid circuit 120. The 90° hybrid circuit 120 branches each of the input waves into two waves. Then, the 90° hybrid circuit 120 outputs in-phase components to identical direction output terminals (output terminals 203 and 204 with respect to the input terminals 201 and 202, respectively), and outputs 90°-phase-shifted components to cross-direction output terminals (output terminals 204 and 203 with respect to the input terminals 201 and 202, respectively). That is, on a side of each of the output terminals 203 and 204, one of the two branched waves is shifted by 90° and combined with the other branched wave. In the above-mentioned manner, two constant-amplitude waves A and B having constant envelopes having equal amplitudes are obtained at the output terminals 203 and 204.

The constant-amplitude waves A and B pass through the amplifiers 140 and 150, which can be formed of highly efficient non-linear amplifiers, such as C-class amplifiers, and are input to input terminals 301 and 302 of a −90° hybrid circuit 130 (which corresponds to the combination amplifier 185 shown in FIG. 17). The −90° hybrid circuit 130 operates in the same way as the 90° hybrid circuit 120 except that the phase rotating angle is −90°. The −90° hybrid circuit 130 outputs an output wave kX which is an amplified version of the input wave X to an output terminal 303 connected to the output terminal 8, and outputs an output wave kY which is an amplified version of the auxiliary wave Y to an output terminal 304, which wave is terminated via the resistor 21.

A description will now be given of the operation of the amplifier shown in FIG. 18 with respect to FIG. 19. Assuming that the amplitude of the input wave is equal to 2 X, the approximate solution generating circuit 16 generates an auxiliary wave 2 Y according to the characteristic II shown in FIG. 12, and outputs it to the input terminal 202 of the 90° hybrid circuit 120. The 90° hybrid circuit outputs the constant-amplitude wave A obtained by combining the input wave X and a 90°-phase-shifted version of the auxiliary wave Y to the output terminal 203, and outputs the constant-amplitude wave B obtained by combining a 90°-phase-shifted version of the input wave X and the auxiliary wave Y to the output terminal 204. The amplitudes of the constant-amplitude waves A and B are equal to each other, that is, $|A|=|B|$. The constant-amplitude waves A and B are respectively amplified by the amplifiers 140 and 150, so that amplified outputs kA and kB are generated and output by the amplifiers 140 and 150, respectively.

The −90° hybrid circuit 130 combines the amplified outputs kA and kB, and outputs the output wave 2 kX obtained by the amplified output kA and a −90°-phase-shifted version of the amplified output kB to the output terminal 303, so that the orthogonal components are canceled. Further, the −90° hybrid circuit 130 outputs the output wave 2 kY obtained by a −90°-phase-shifted version of the amplified output kA and the amplified output kB to the output terminal 304, so that the orthogonal components are canceled.

It will be noted that the constant-amplitude waves A and B can be generated by a simple analog circuit comprising the approximate solution circuit 16 and the 90° hybrid circuit 120.

Figure 19:
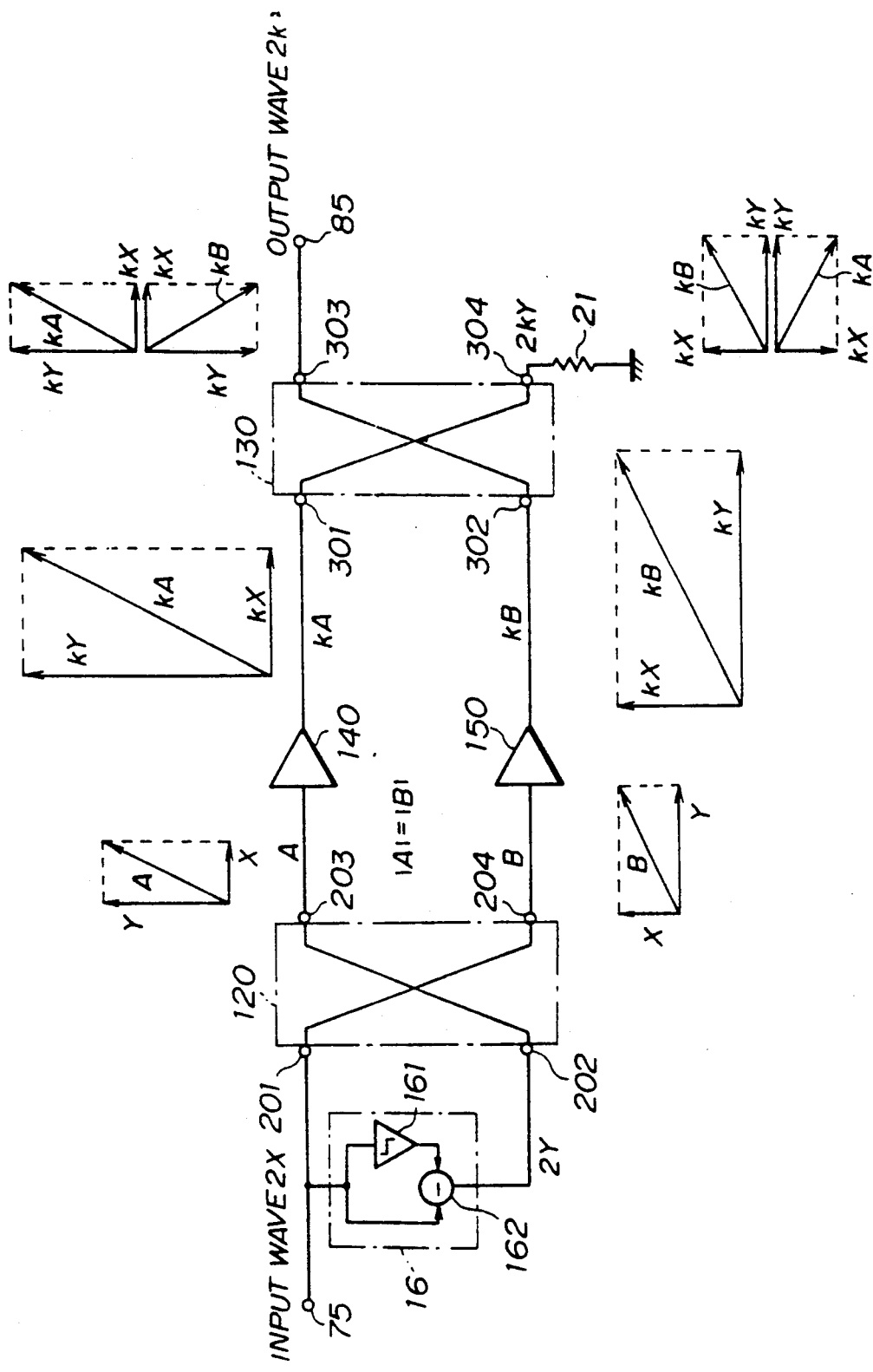
FIG. 19 is a block diagram illustrating the operation of the configuration shown in FIG. 18.
Figure 20:
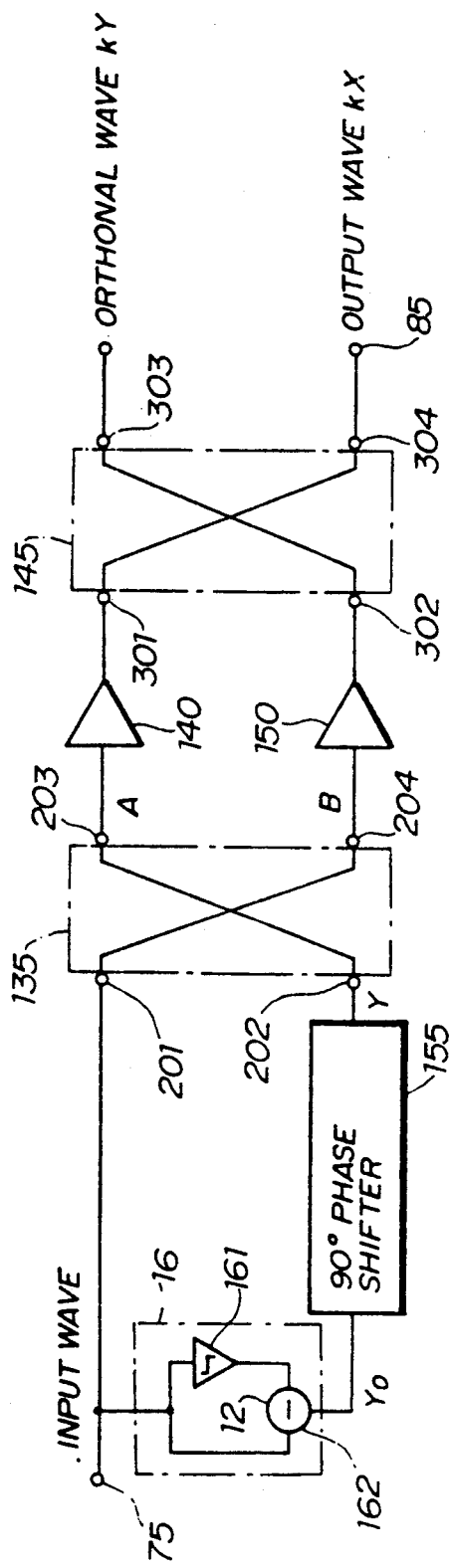
FIG. 20 is a block diagram illustrating a variation of the configuration shown in FIG. 19.

FIG. 20 is a variation of the configuration shown in FIG. 19. In FIG. 20, those parts which are the same as those shown in FIG. 19 are given the same reference numerals. A 90° phase shifter 155 is connected between the output of the approximate solution circuit 16 and the input terminal 202 of the 90° hybrid circuit 135. A in-phase (or 180°-out-of-phase) hybrid circuit 135 and a 90° hybrid circuit 145 are respectively substituted for the 90° and −90° hybrid circuits 130 and 140 shown in FIG. 18. The auxiliary wave (approximate solution output) from the approximate solution circuit 16, now labeled Yo, passes through the 90° phase shifter 155, so that the auxiliary wave Y orthogonal to the input wave X can be generated and supplied to the input terminal 202 of the in-phase hybrid circuit 135. With this arrangement, it is also possible to generate the constant-amplitude waves A and B which are supplied to the amplifiers 140 and 150, respectively and obtain the output wave kX which is an amplified version of the input wave X.

A description will now be given of a constant-amplitude wave combination type amplifier according to a sixth preferred embodiment of the present invention with reference to FIG. 21, in which those parts which are the same as those shown in the previous figures are given the same reference numerals.

Figure 21:
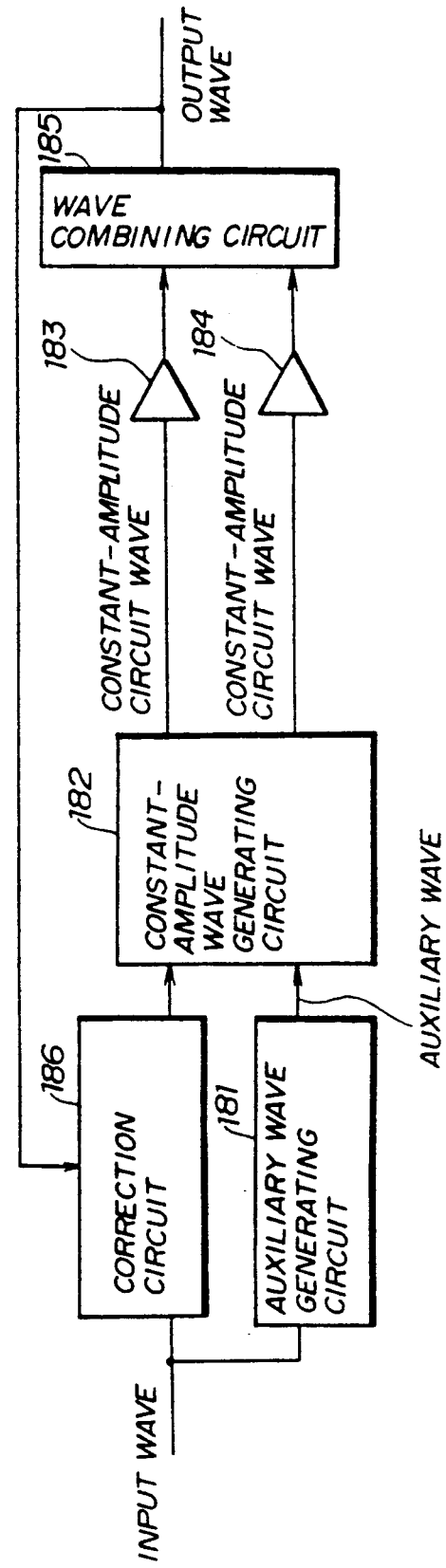
FIG. 21 is a block diagram illustrating an outline of a constant-amplitude wave combination type amplifier according to a sixth preferred embodiment of the present invention.

The configuration shown in FIG. 21 is obtained by adding a correction circuit 186 to the configuration shown in FIG. 17. The correction circuit 186 detects a distortion component contained in the output wave generated by the wave combining circuit 185, generates a correction value which cancels the detected distortion component, and adds the correction value to the input wave. With the above arrangement, it is possible to suppress the occurrence of a distortion of the output wave.

Figure 22:
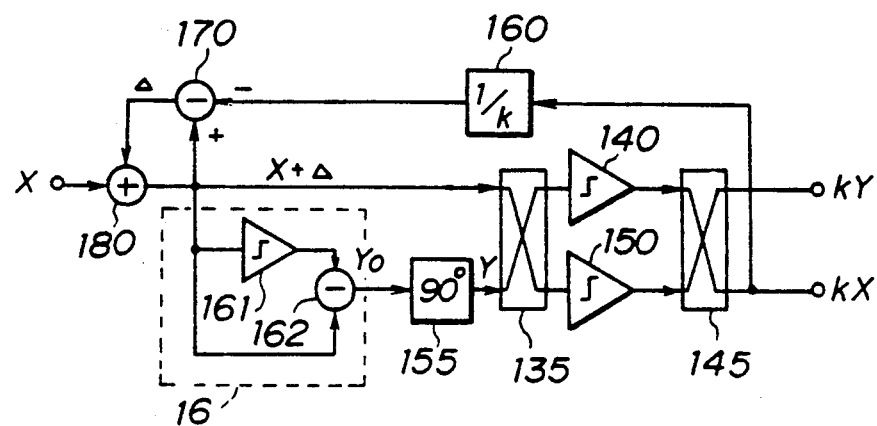
FIG. 22 is a block diagram illustrating the configuration shown in FIG. 21 in more detail.

FIG. 22 illustrates the configuration shown in FIG. 21 in more detail. In FIG. 22, those parts which are the same as those shown in FIG. 20 are given the same reference numerals. The correction circuit 186 shown in FIG. 21 has an attenuator 160 having an attenuation level 1/k, a subtracter 170 and an adder 180. The output wave kX passes through the attenuator 160, and is applied to the subtracter 170, which also receives the input wave X which has passed through the adder 180. The subtracter 170 subtracts the signal from the attenuator 160 from the input wave X from the adder 180, and generates a distortion component Δ contained in the output wave kX. The adder 180 adds the distortion component Δ to the input wave X, and outputs a signal X+Δ to the in-phase (or 180°-out-of-phase) hybrid circuit 125.

A description will now be given of the operation of the amplifier shown in FIG. 22. It is now assumed that a distortion kΔ occurs in the output wave kX due to the fact that the approximate solution circuit 16 generates the approximate solution output. The output wave containing the distortion kΔ (that is, kX+kΔ) is attenuated (multiplied) by 1/k through the attenuator 160, and applied to the subtracter 170. Then, the subtracter 170 subtracts the (X+Δ) from the input wave X and generates the distortion component Δ. The adder 180 adds the distortion component Δ to the input wave X in such a way that the distortion component Δ has a polarity which cancels the distortion component kΔ in the output wave kX. In this way, the component kΔ in the output wave kX is reduced.

Figure 23:
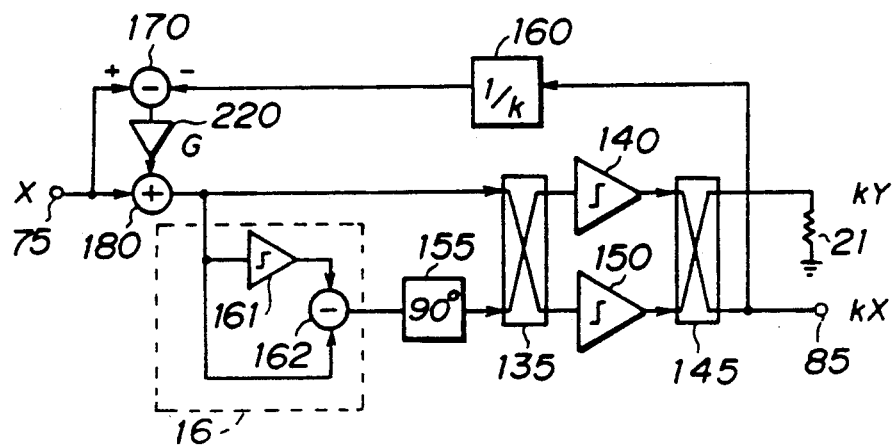
FIG. 23 is a block diagram illustrating a variation of the configuration shown in FIG. 22.

FIG. 23 illustrates a variation of the configuration shown in FIG. 22. In FIG. 23, those parts which are the same as those shown in FIG. 22 are given the same reference numerals. The subtracter 170 subtracts the wave supplied from the attenuator 160 from the input wave obtained before it is input to the adder 180, and generates the distortion component Δ. An amplifier 220, which is provided between the subtracter 170 and the adder 180, amplifies the distortion component Δ so that it has an amplified amplitude sufficient to cancel the distortion kΔ contained in the output wave kX. Except the above, the operation is the same as that of the amplifier shown in FIG. 22.

Figure 24:
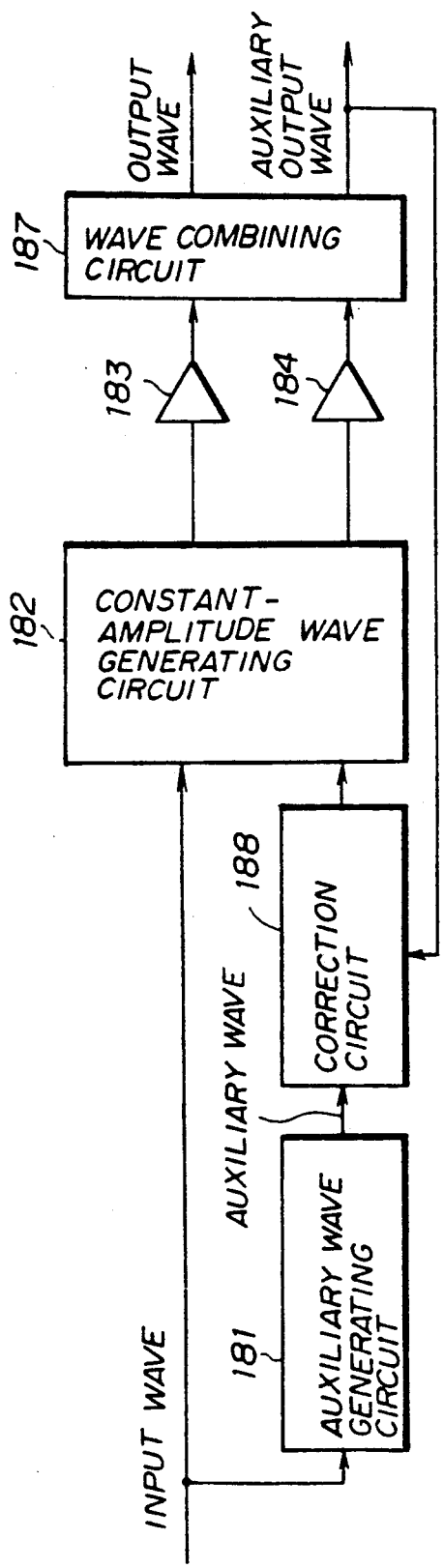
FIG. 24 is a block diagram illustrating an outline of a constant-amplitude wave combination type amplifier according to a seventh preferred embodiment of the present invention.

A description will now be given of a constant-amplitude wave combination type amplifier according to a seventh preferred embodiment of the present invention with reference to FIG. 24, in which those parts which are the same as those shown in the previous figures are given the same reference numerals. As shown in FIG. 24, a correction circuit 188 is provided between the auxiliary wave generating circuit 181 and the constant-amplitude wave generating circuit 182. The correction circuit 188 compares the auxiliary wave with an auxiliary output wave generated by a wave combining circuit 187 to generate a distortion component contained in the output wave, and generates a correction value which cancels the distortion component in the output wave on the basis of the comparison result. The correction value is added to the auxiliary wave generated by the auxiliary wave generating circuit 181.

Figure 25:
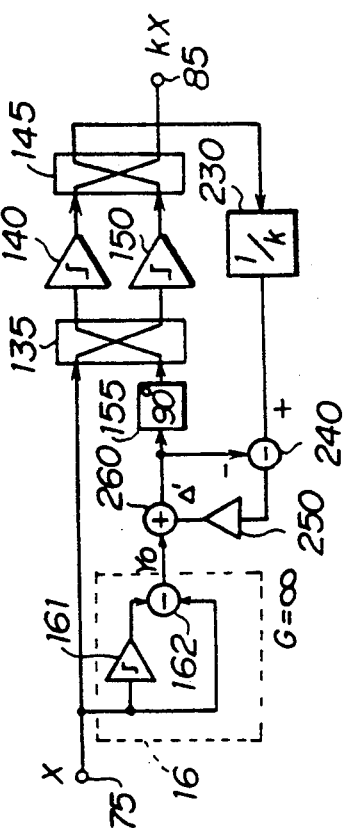
FIG. 25 is a block diagram illustrating the configuration shown in FIG. 24 in more detail.

FIG. 25 illustrates the configuration shown in FIG. 24 in more detail. In FIG. 25, those parts which are the same as those shown in the previous figures are given the same reference numerals. The correction circuit 188 shown in FIG. 24 is made up of an attenuator 230 having an attenuation level 1/k, a subtracter 240, an amplifier 250 and an adder 260. The auxiliary output wave kY generated by the hybrid circuit 145 is attenuated (multiplied) by 1/k, and applied to the subtracter 240. The subtracter 240 subtracts an output of the adder 260 from the output from the attenuator 230, and outputs a difference signal to the adder 260 via the amplifier 250. The difference signal having an amplified signal serves as a correction value Δ indicative of a distortion component contained in the output wave kX. The adder 260 adds the correction value Δ and the auxiliary wave generated and output by the approximate solution circuit 16, now labeled Yo, and outputs an addition result to the hybrid circuit 135 through the 90° phase shifter 155.

The magnitude of the correction value Δ is adjusted so that as shown in FIG. 12, it is equal to a deviation Δ′ between the input/output characteristic II of the approximate solution circuit 16 and the ideal circular characteristic I. The input/output characteristic of the approximate solution circuit 16 including the correction circuit 188 is corrected by adding the correction value Δ′ to the auxiliary wave Yo, so that it approximately has the circular characteristic. With this arrangement, it becomes possible to generate the constant-amplitude waves A and B to definitely have the constant amplitudes and thus reduce the distortion in the auxiliary output wave kY. It will be noted that when the distortion in the auxiliary output wave kY is reduced, the distortion in the output wave xK is also reduced.

Figure 26:
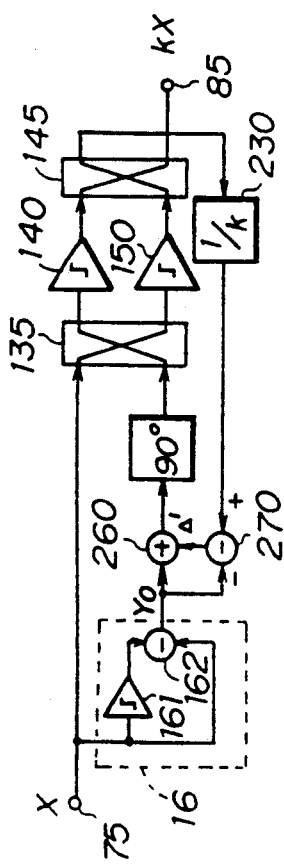
FIG. 26 is a block diagram illustrating a variation of the configuration shown in FIG. 25.

FIG. 26 illustrates a variation of the configuration shown in FIG. 25. In FIG. 26, those parts which are the same as those shown in FIG. 25 are given the same reference numerals. The variation shown in FIG. 26 is different from the amplifier shown in FIG. 25 in that a subtracter 270 calculates the difference (correction value) Δ' between the signal from the attenuator 230 and the auxiliary wave Yo from the approximate solution circuit 16, and the adder 260 adds the correction values Δ' to the auxiliary wave Yo. Except for the above operation, the operation of the amplifier shown in FIG. 26 is the same as that of the amplifier shown in FIG. 25.

Figure 27:
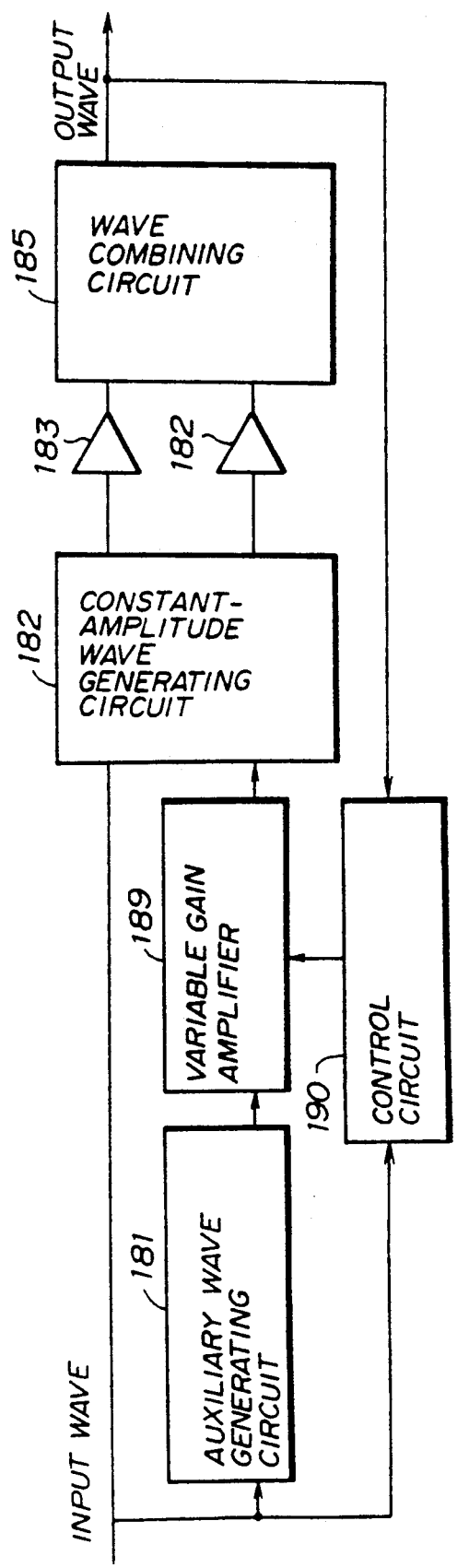
FIG. 27 is a block diagram of a constant-amplitude wave combination type amplifier according to an eighth preferred embodiment of the present invention.

A description will now be given of a constant-amplitude wave combination type amplifier according to an eighth preferred embodiment of the present invention with reference to FIG. 27, in which those parts which are the same as those shown in the previous figures are given the same reference numerals. As shown in FIG. 27, a variable gain amplifier 189 is provided between the auxiliary wave generating circuit 181 and the constant-amplitude wave generating circuit 182. A control circuit 190 compares the input wave with the output wave to detect a distortion component in the output wave output by the wave combining circuit 185, and controls the gain of the variable gain amplifier 189 so that the detected distortion component is canceled.

Figure 28:
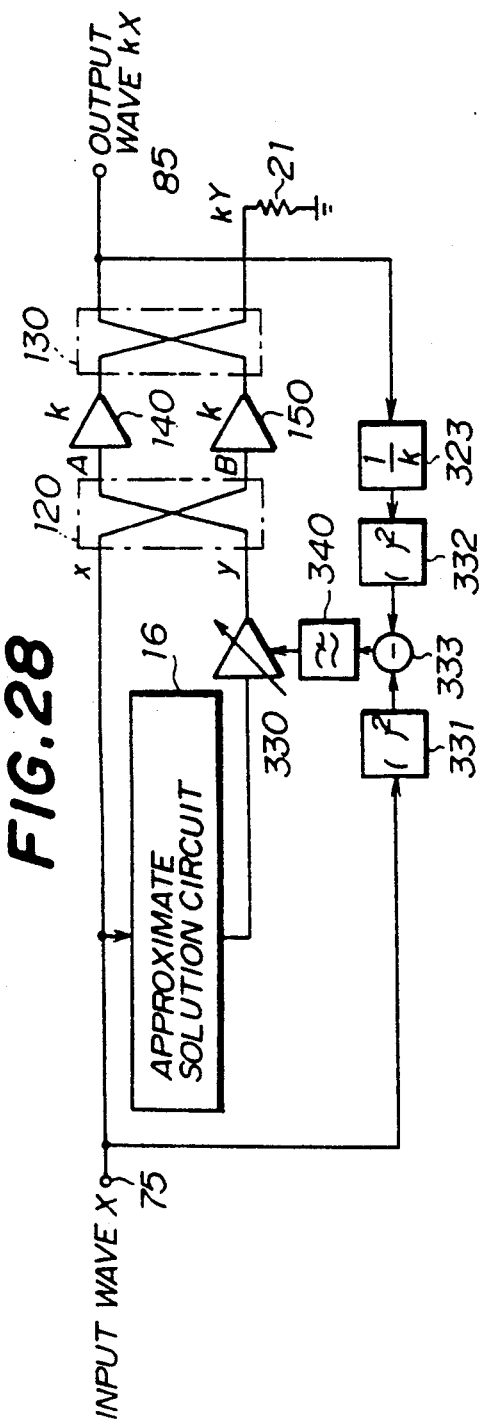
FIG. 28 is a block diagram illustrating the configuration shown in FIG. 27 in more detail.

FIG. 28 illustrates the configuration of the amplifier shown in FIG. 27 in more detail. In FIG. 28, those parts which are the same as those shown in the previous figures are given the same reference numerals. The variable gain amplifier 189 is formed of an AGC amplifier 340. The control circuit 190 shown in FIG. 27 has square-law circuits 331 and 332, an attenuator having an attenuation level 1/k, a subtracter 333, and a lowpass filter 340.

The output wave kX from the −90° hybrid circuit 130 is attenuated (multiplexed) by the attenuation level 1/k. The square-law circuit 332 squares the wave from the attenuator 323, and outputs a squared output to the subtracter 333. On the other hand, the input wave X is squared by the square-law circuit 331, and applied to the subtracter 333. The subtracter 333 calculates the difference Δ between the outputs of the square-law circuits 331 and 332. A signal indicative of the difference Δ passes through the lowpass filter 340, so that a D.C. component of the signal is applied, as a gain control voltage, to the AGC amplifier 330. The AGC amplifier 330 amplifies the approximate solution output from the approximate solution circuit 16 by the gain designated by the gain control voltage, so that the linear relationship between the input wave X and the output wave Y can be obtained.

When the auxiliary wave (approximate solution output) Y generated by the approximate solution circuit 16 has the ideal circular characteristic I shown in FIG. 12, the output wave kY generated and output by the hybrid circuit 130 does not have any distortion theoretically. However, generally, a distortion component will be contained in the output wave kX. The distortion component contained in the output wave kX is extracted by the subtracter 333, and the gain of the AGC amplifier 330 is controlled so that the detected distortion component becomes zero. With this control, it becomes possible for the auxiliary wave Y to approximately have the circular characteristic I shown in FIG. 12.

Figure 29:
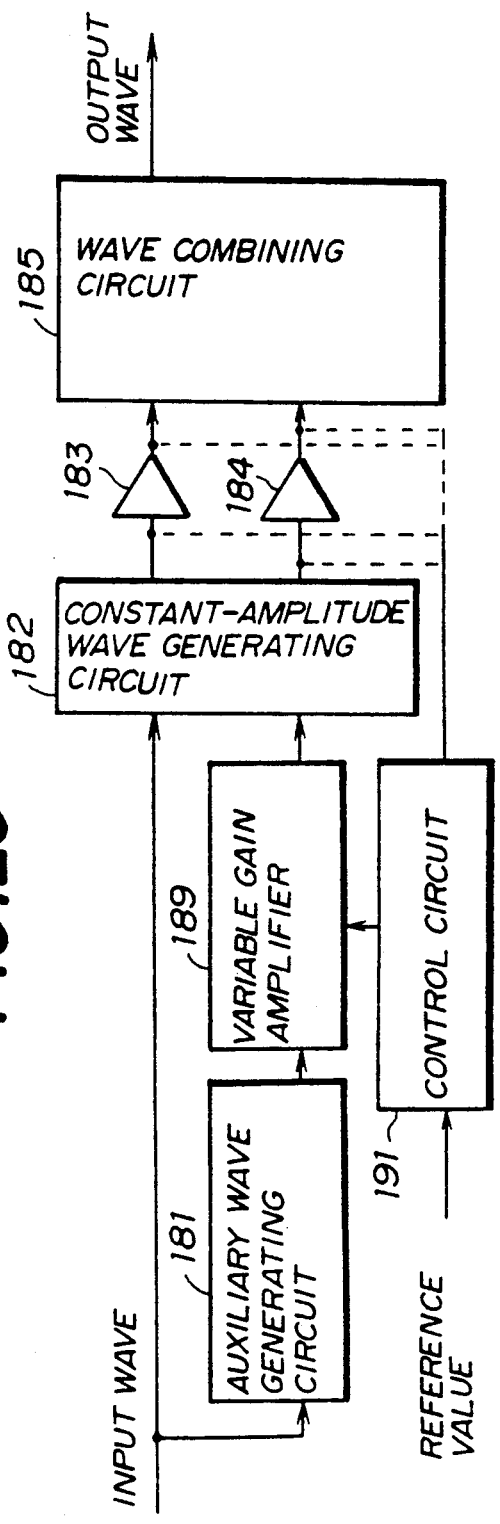
FIG. 29 is a block diagram illustrating an outline of a constant-amplitude wave combination type amplifier according to a ninth preferred embodiment of the present invention.

FIG. 29 illustrates a constant-amplitude wave combination type amplifier according to a ninth embodiment of the present invention. In FIG. 29, those parts which are the same as those shown in FIG. 27 are given the same reference numerals. A control circuit 191 is substituted for the control circuit 190 shown in FIG. 27. The control circuit 191 compares one of the constant-amplitude waves generated by the constant amplitude wave generating circuit 182 or the amplified versions thereof obtained from the amplifiers 183 and 184 with a predetermined reference value, and controls the gain of the variable gain amplifier 189 on the basis of the comparison result so that the constant-amplitude waves have constant amplitudes.

Figure 30:
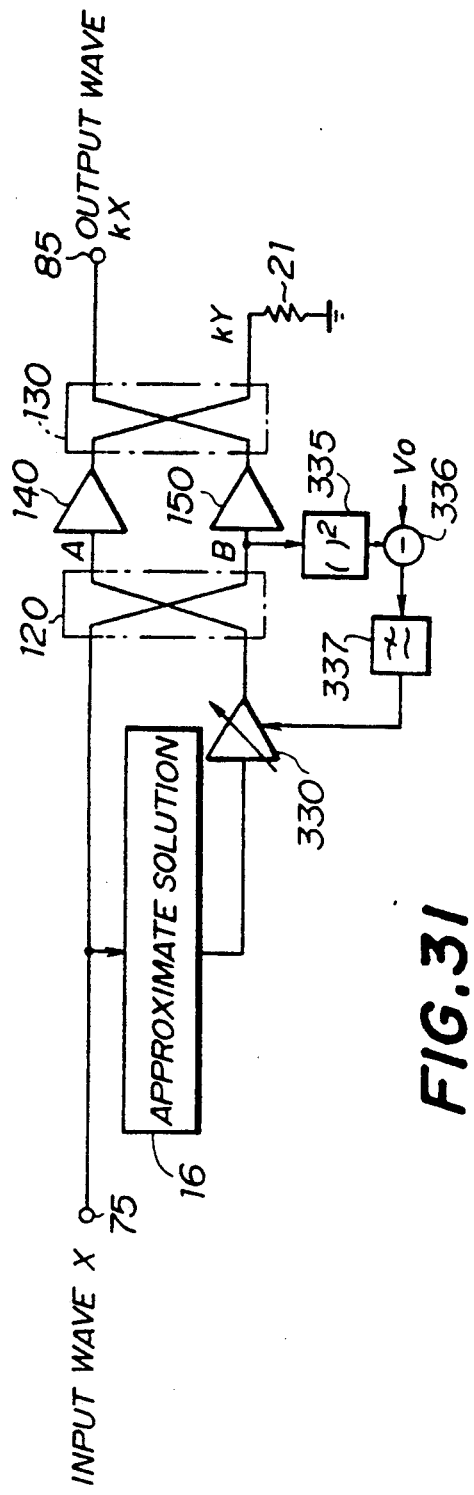
FIG. 30 is a block diagram illustrating the configuration shown in FIG. 29 in more detail.

FIG. 30 illustrates the configuration shown in FIG. 29 in more detail. In FIG. 30, those parts which are the same as those shown in FIG. 28 are given the same reference numerals. The control circuit 191 shown in FIG. 29 is made up of a square-law circuit 335, a subtracter 336 and a lowpass filter 337. The constant-amplitude wave B generated by the hybrid circuit 120 is squared by the square-law circuit 335, and a squared value is applied to the subtracter 336. The subtracter 336 calculates the difference between the squared value from the square-law circuit 335 and a predetermined reference value Vo. A signal indicative of the above difference passes through the lowpass filter 337, so that a D.C. component contained in the output of the lowpass filter is applied, as the gain control signal, to the AGC amplifier 330. The gain of the AGC amplifier 330 is controlled so that the difference calculated by the subtracter 336 becomes zero.

When the input/output characteristic of the approximate solution circuit 16 corresponds to the ideal circular characteristic I shown in FIG. 12, the constant-amplitude waves A and B generated by the constant-amplitude wave generating circuit 120 have definitely constant envelope amplitudes. On the other hand, when the input/output characteristic of the approximate solution circuit 16 corresponds to the approximate characteristic II shown in FIG. 12, the amplitudes of the constant-amplitude waves A and B have slight variations. The configuration shown in FIG. 30 is based on the above-mentioned fact. By controlling the gain of the AGC amplifier 330 so that the difference calculated by the subtracter 336 becomes zero, the auxiliary wave generated by the approximate solution circuit 16 has the ideal characteristic I shown in FIG. 12.

Figure 31:
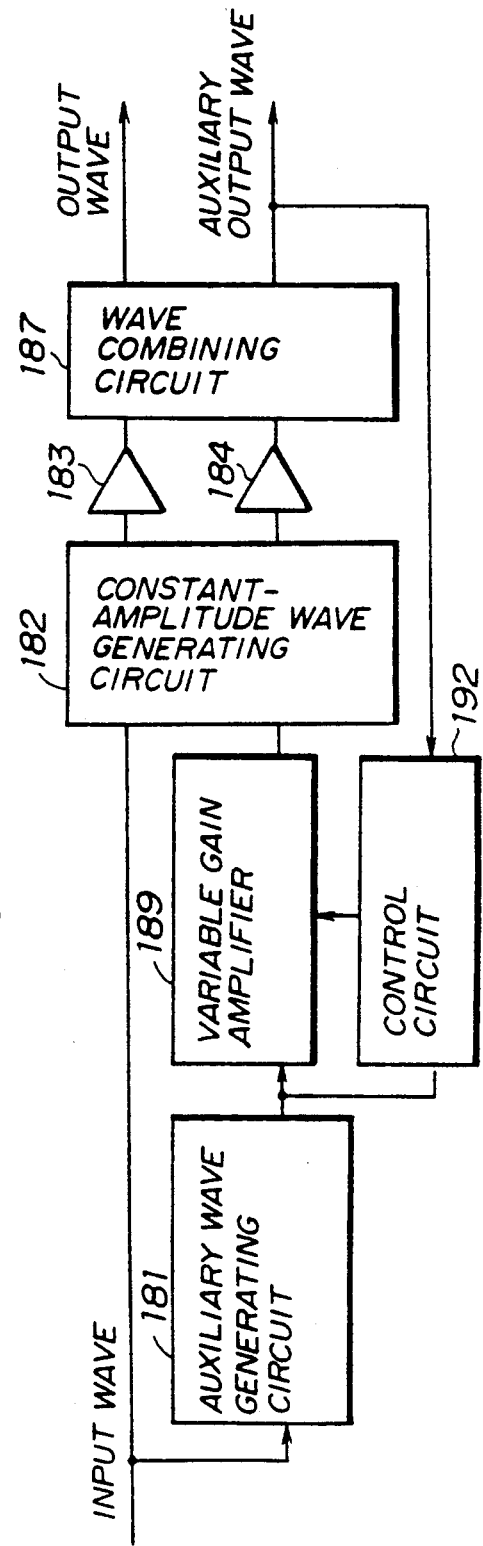
FIG. 31 is a block diagram illustrating an outline of a constant-amplitude amplitude wave combination type amplifier according to a tenth preferred embodiment of the present invention.

FIG. 31 shows a constant-amplitude wave combination type amplifier according to a tenth preferred embodiment of the present invention. In FIG. 31, those parts which are the same as those shown in FIG. 27 are given the same reference numerals. A control circuit 192 is substituted for the control circuit 190 shown in FIG. 27. The control circuit 192 compares the output of an auxiliary output wave generated by the wave combining circuit 187 with the auxiliary wave generated by the auxiliary wave generating circuit 181 to detect a distortion component contained in the auxiliary output wave, and controls the gain of the variable gain amplifier 189 so that the distortion component in the auxiliary output wave is canceled.

Figure 32:
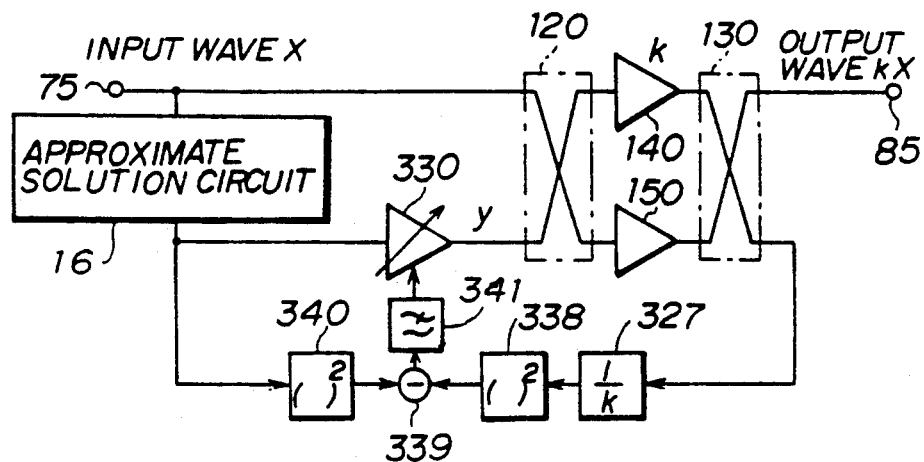
FIG. 32 is a block diagram illustrating the configuration shown in FIG. 31 in more detail.

FIG. 32 illustrates the configuration shown in FIG. 31 in more detail. In FIG. 32, those parts which are the same as those shown in FIG. 30 are given the same reference numerals. The control circuit 192 shown in FIG. 31 has an attenuator 327 having an attenuation level 1/k, two square-law circuits 338 and 340, a subtracter 339 and a lowpass filter 341. The configuration shown in FIG. 32 differs from that shown in FIG. 28 in that the square-law circuit 340 receives the auxiliary wave from the approximate solution circuit 16, and the attenuator 327 receives the auxiliary output wave kY generated by the wave combining circuit 130.

The auxiliary output wave kY passes through the attenuator 327 and the square-law circuit 338, and is then applied to the subtracter 339. On the other hand, the auxiliary wave from the approximate solution circuit 16 passes through the square-law circuit 340, and is then applied to the subtracter 339. The subtracter 339 calculates the difference between the outputs of the square-law circuits 328 and 340. A signal indicative of the difference passes through the lowpass filter 341, so that a D.C. component contained in the signal from the subtracter 339 is applied, as the gain control signal, to the AGC amplifier 130. With the above-mentioned arrangement, the auxiliary wave from the approximate solution circuit 16 approximately has the circular characteristic I shown in FIG. 12.

Figure 33:
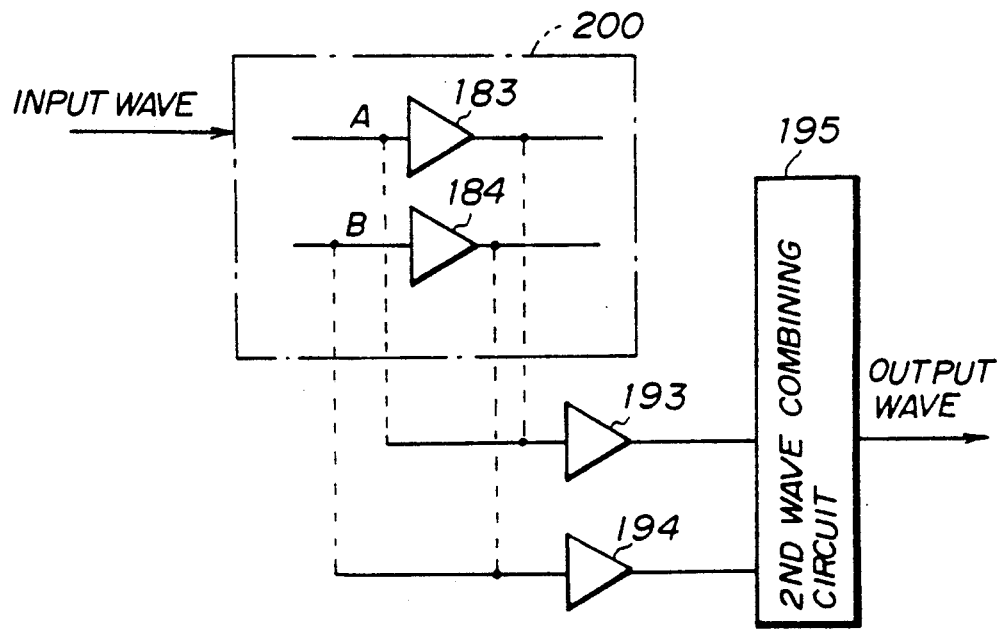
FIG. 33 is a block diagram illustrating an outline of a constant-amplitude wave combination type amplifier according to an eleventh preferred embodiment of the present invention.

FIG. 33 illustrates a constant-amplitude wave combination type amplifier according to an eleventh embodiment of the present invention. The amplifier shown in FIG. 33 has an amplifier which is any one of the aforementioned fifth through tenth embodiments of the present invention, two amplifiers 193 and 194, and a second wave combining circuit 195 (it will be noted that the "first" combination circuit is contained in the amplifier 200). The amplifier 193 amplifies the constant-amplitude wave A or its amplified version, and the amplifier 194 amplifies the constant-amplitude wave B or its amplified version. Amplified outputs of the amplifiers 193 and 194 are combined by the second wave combining circuit 195, so that an output wave is generated.

FIG. 34 illustrates the configuration shown in FIG. 33 in more detail. The constant-amplitude waves A and B are amplified by amplifiers 351 and 352, which output amplified constant-amplitude waves mA and mB, respectively, where m is the respective gains of the amplifiers 351 and 352. Alternatively, it is also possible to design the configuration shown in FIG. 34 so that the amplifiers 351 and 352 amplify the amplified constant-amplitude waves kA and kB, respectively. A hybrid circuit 353 combines the waves mA and mB and generates an output wave mX which is an amplified version of the input wave X.

A description will now be given of a constant-amplitude wave combination type amplifier according to a twelfth embodiment of the present invention with reference to FIG. 35. The amplifier shown in FIG. 35 has first and second wave combining circuits 442 and 445, two amplifiers 443 and 444, a variable frequency generator 41 and a control circuit 446. The variable frequency generator 441 generates a first constant-amplitude wave, and the first wave combining circuit 442 generates a second constant-amplitude wave. The amplifiers 443 and 444 amplify the first and second constant-amplitude waves, respectively, and output amplified waves to the second wave combining circuit 445. The control circuit 446 calculates the difference between the first and second constant-amplitude waves, and controls the variable frequency generator 441 on the basis of the calculation result so that the above-mentioned difference becomes zero. With the above arrangement, it is possible to generate the constant-amplitude waves which have constant envelope amplitudes. Thus, the amplifiers 443 and 444 can be formed of analog non-linear amplifiers, and the output wave has little distortion.

Figure 36:
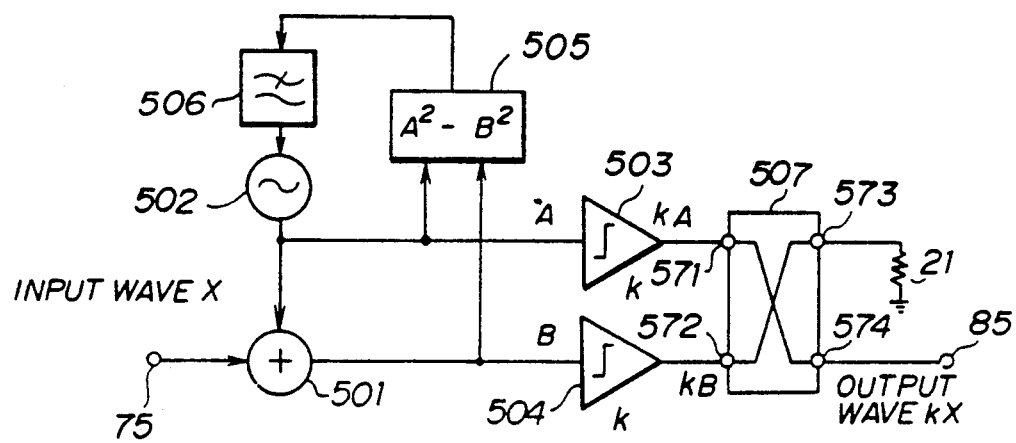
FIG. 36 is a block diagram illustrating the configuration shown in FIG. 35 in more detail.

FIG. 36 shows the configuration shown in FIG. 35 in more detail. The input wave X is applied to an adder 501 via the input terminal 75. The adder 501 adds an input wave X and a constant-amplitude wave A generated by a voltage-controlled oscillator 502, which generates a constant-amplitude wave B therefrom. The constant-amplitude waves A and B are supplied to an operation circuit 505, which carries out an operation $A^2-B^2$. The operation result indicates a value corresponding to the difference between the amplitudes of the constant-amplitude waves A and B, and is supplied to the voltage-controlled oscillator 502 via a lowpass filter 506. The lowpass filter 506 extracts a D.C. component from the output of the operation circuit 505. The D.C. component is supplied to the voltage-controlled oscillator 502 as a control signal (voltage) which corrects a phase error.

The constant-amplitude waves A and B are amplified by amplifiers 503 and 504, respectively, each having an amplification gain k. The amplifiers 503 and 504 can be formed of linear amplifiers, such as C-class amplifiers. Amplified outputs kA and kB output by the amplifiers 503 and 504 are applied to input terminals 571 and 572, respectively, of a 180°-out-of-phase hybrid circuit 507. The hybrid circuit 507 branches each of the amplified waves kA and kB into two waves. Then, the hybrid circuit 507 outputs in-phase components to identical direction output terminals (output terminals 573 and 574 with respect to the input terminals 571 and 572, respectively), and outputs 180°-out-of-phase components to cross-direction output terminals (output terminals 574 and 573 with respect to the input terminals 571 and 572, respectively). An output wave kX, which is an amplified version of the input wave X, is obtained at the output terminal 574 of the hybrid circuit 507. The output terminal 574 is terminated via the terminating resistor 21.

Figure 37:
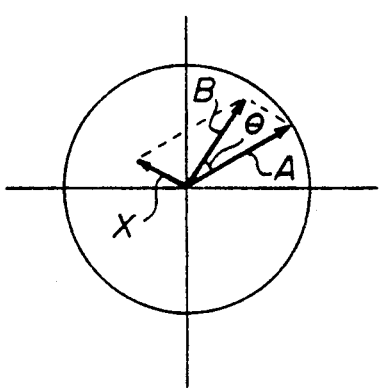
FIGS. 37, 38 and 39 are respectively graphs illustrating the operation of the configuration shown in FIG. 36.

The operation of the amplifier shown in FIG. 36 will now be explained. The input wave X is added to the constant-amplitude wave A from the voltage-controlled oscillator 502 on the vector base, so that the constant-amplitude wave B is output by the adder 501. If no phase shift control is carried out, the waves A, B and X will have a relationship shown in FIG. 37. The amplitude of the constant-amplitude wave A is different from that of the combined wave B. Further, the amplitude of the combined wave B varies in accordance with a change of the amplitude of the constant-amplitude wave A. Thus, the combined wave B does not have a constant amplitude.

Figure 38:
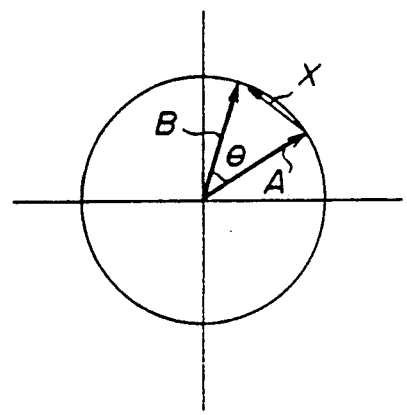

The operation circuit 505 carries out the operation $A^2-B^2$, and the oscillating frequency (or phase) of the voltage-controlled oscillator 502 is controlled so that $A^2-B^2=0$. That is, a phase angle $\Delta\theta$ between the waves A and B is adjusted so that the amplitudes of the waves A and B are equal to each other. In the state where $A^2-B^2=0$, the amplifier shown in FIG. 36 can operate stably. That is, as shown in FIG. 38, the vector loci of the waves A and B are on a circle, so that the combined wave B can have a constant amplitude. As a result, the amplifiers 503 and 504 can be formed of analog non-linear amplifiers, such as C-class amplifiers.

Figure 39:
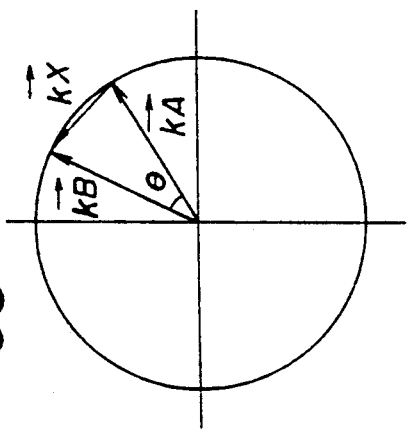

The amplified outputs kA and kB are input to the hybrid circuit 507, and combined therein. FIG. 39 illustrates a phase relationship between the amplified outputs kA and kB. An output wave $k(B-A)$ appears at the output terminal 574, which is an amplified version of the input wave X. That is, $kX = k(B-A)$.

Figure 40:
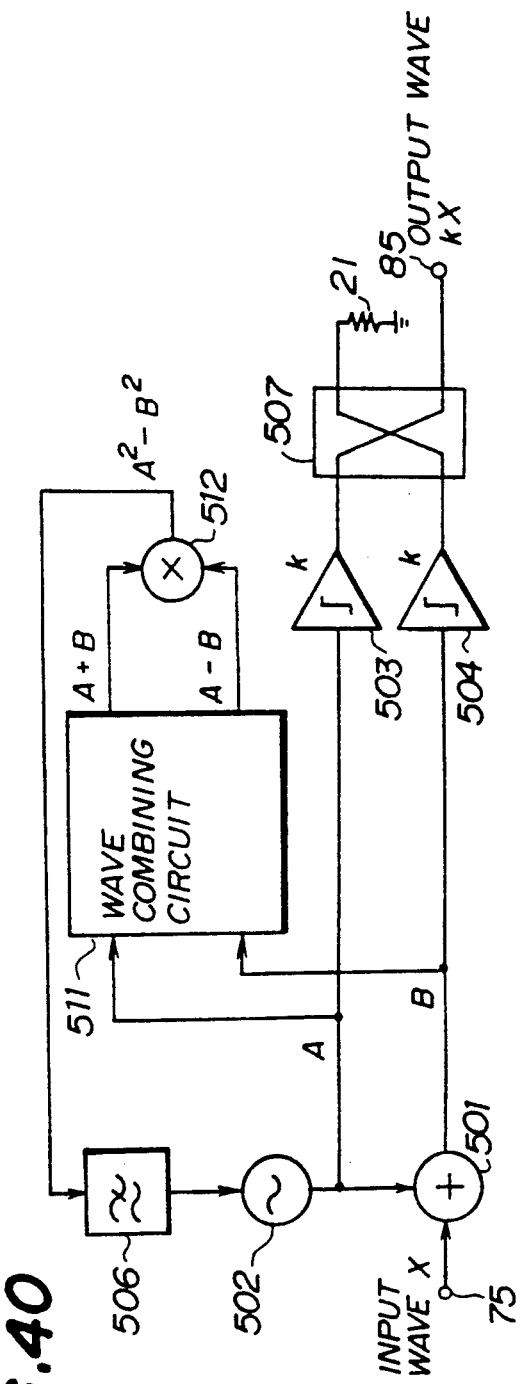
FIG. 40 is a block diagram illustrating a variation of the configuration shown in FIG. 36.

FIG. 40 illustrates a variation shown in FIG. 35. In FIG. 40, those parts which are the same as those shown in FIG. 36 are given the same reference numerals. The operation circuit 505 shown in FIG. 36 is replaced by a wave combining circuit 511 and a multiplier 512. The wave combining circuit 511 combines the constant-amplitude waves A and B and generates two composite waves $A+B$ and $A-B$. The multiplier 512 multiplies the wave $A+B$ by the wave $A-B$, and outputs $A^2-B^2$, which passes through the lowpass filter 506, and is applied to the voltage-controlled oscillator 502.

A description will now be given of a constant-amplitude wave combination circuit according to a thirteenth embodiment of the present invention with reference to FIG. 41, in which those parts which are the same as those shown in FIG. 35 are given the same reference numerals. A control circuit 447 is substituted for the control circuit 446 shown in FIG. 35. The control circuit 447 extracts a distortion component contained in the output wave, and controls the gain of the variable frequency generator 441 so that the extracted distortion component is reduced. When the distortion component is sufficiently reduced, the first and second constant-amplitude waves generated respectively by the variable frequency generator 441 and the first wave combining circuit 442 have constant envelope amplitudes.

FIG. 42 illustrates the configuration shown in FIG. 41 in more detail. In FIG. 42, those parts which are the same as those shown in FIG. 36 are given the same reference numerals. The control circuit 447 shown in FIG. 41 is made up of an attenuator 513 having an attenuation level 1/k, two limiter amplifiers 514 and 515, a multiplier 516 and a lowpass filter 506. The output wave kX generated by the 180°-out-of-phase hybrid circuit 507 passes through the attenuator 513 and the limiter amplifier 514, and is applied to the multiplier 516. On the other hand, the input wave X passes through the limiter amplifier 515 and is applied to the multiplier 516. The multiplier 516 multiplies the output from the limiter amplifier 514 by the output from the limiter amplifier 515, and generates a distortion component Δ contained in the output wave kX. The distortion component passes through the lowpass filter 506, and is applied, as the frequency (phase) control voltage, to the voltage-controlled oscillator 502.

If the combined wave B from the adder 501 is not a constant-amplitude wave, the amplified output kB will be distorted since the amplifier 504 is formed of a non-linear amplifier. Thus, the output wave kX will contain a distortion component. It can be seen from the above that if the combined wave B is a constant-amplitude wave, it is possible to minimize the distortion component contained in the output wave kX generated by the 180°-out-of-phase hybrid circuit 507.

The distortion component in the output wave kX is extracted by means of the attenuator 513, the limiter amplifiers 514 and 515 and the multiplier 516, and applied, as the frequency (or phase) control voltage, to the voltage-controlled oscillator 502. With the above control, the distortion component in the output wave kX is reduced, so that the combined wave B becomes a constant-amplitude wave.

It will be noted that the use of the limiter amplifier 515 is directed to maintaining the input signal at a certain level so that the circuit operation operates in the unstable state when the input wave X becomes small. The limiter amplifier 515 is provided for adjusting the phase relationship between the feedback loop carrying the output wave kX and the feedback loop carrying the input wave X.

Figure 43:
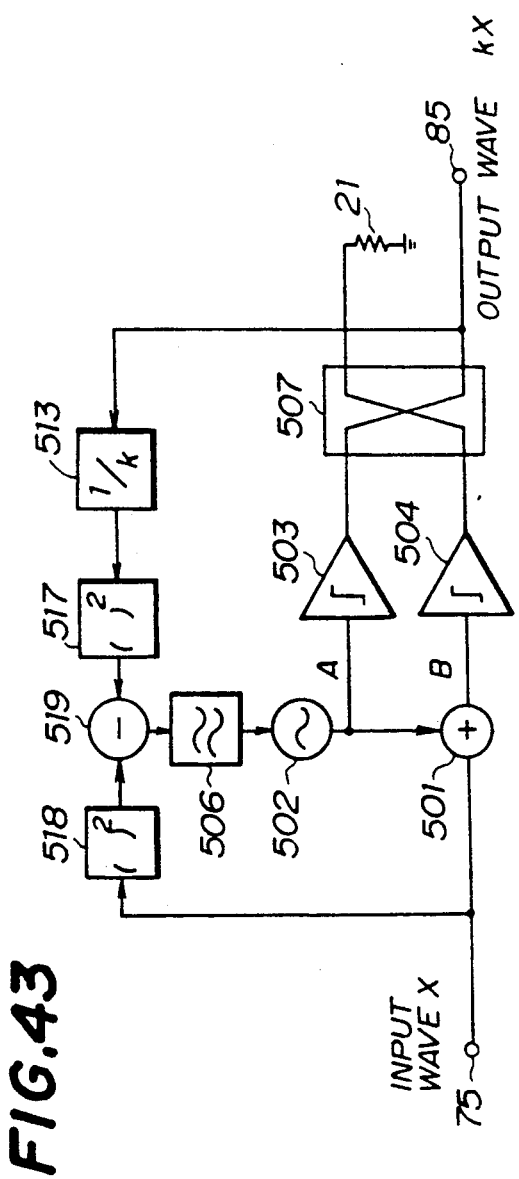
FIG. 43 is a block diagram illustrating a variation of the configuration shown in FIG. 42.

FIG. 43 illustrates a variation of the configuration shown in FIG. 42. In FIG. 43, those parts which are the same as those shown in FIG. 42 are given the same reference numerals. Square-law circuits 517 and 518 are respectively substituted for the limiter amplifiers 514 and 515 shown in FIG. 42, and a subtracter 519 is substituted for the multiplier 516 shown in FIG. 42. The subtracter 519 outputs the distortion component contained in the output wave kX by calculating the difference between the output wave kX passing through the attenuator 513 and the square-law circuit 517 and the input wave X from the square-law circuit 518.

Figure 44:
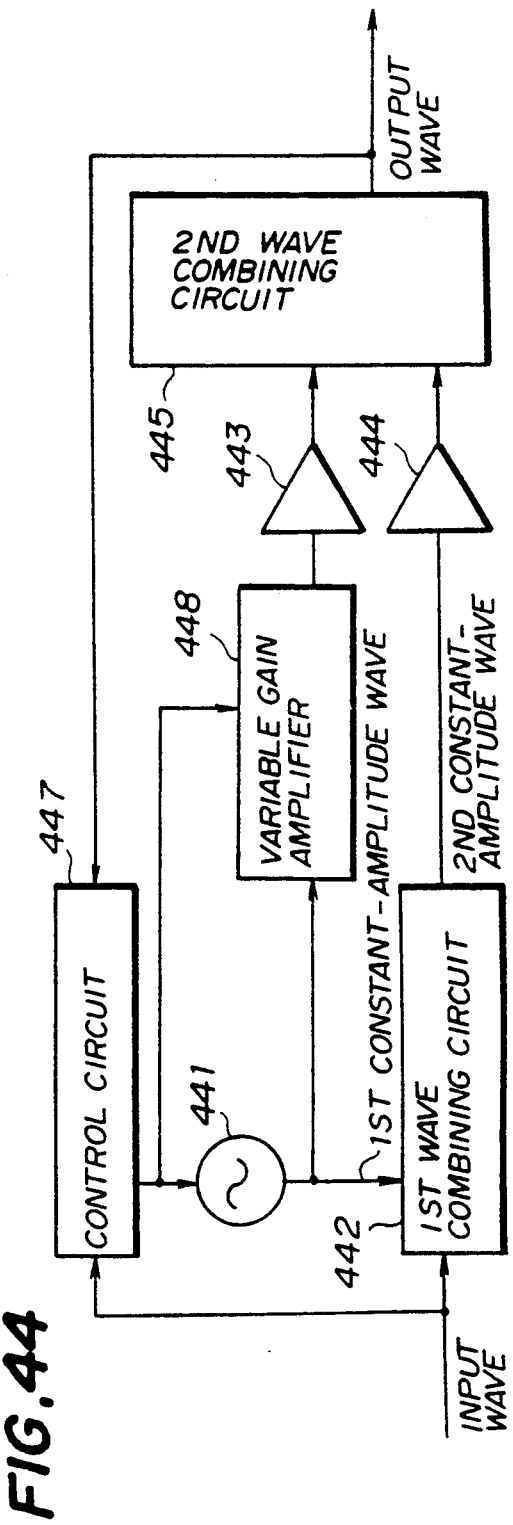
FIG. 44 is a block diagram illustrating an outline of a constant-amplitude wave combination type amplifier according to a fourteenth preferred embodiment of the present invention.

FIG. 44 shows a constant-amplitude wave combination type amplifier according to a fourteenth embodiment of the present invention. In FIG. 44, those parts which are the same as those shown in FIG. 41 are given the same reference numerals. A variable gain amplifier 448 is provided between the output terminal of the variable frequency generator 441 and the amplifier 443. The variable gain amplifier 448 is controlled by the output signal of the control circuit 447 (distortion component) so that an amplitude error occurring between the constant-amplitude waves can be eliminated.

Figure 45:
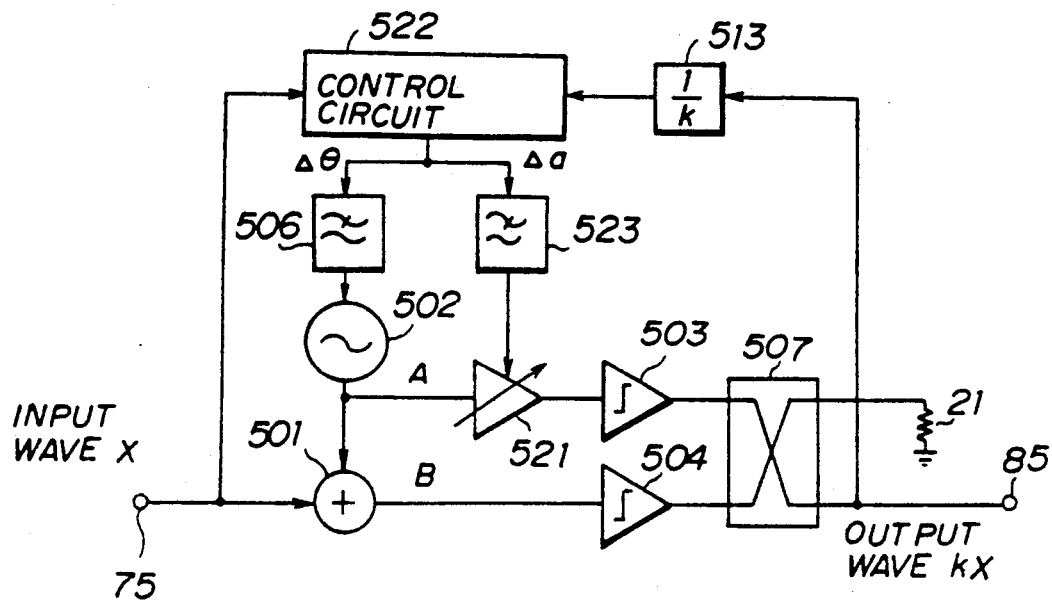
FIG. 45 is a block diagram illustrating the configuration shown in FIG. 44 in more detail.

FIG. 45 illustrates the configuration shown in FIG. 44 in more detail. In FIG. 45, those parts which are the same as those shown in FIG. 42 are given the same reference numerals. The distortion component (Δθ) extracted from the output wave kX by a control circuit functions as the control voltage applied to the voltage-controlled oscillator 502 but also as a control voltage Δa applied to an AGC amplifier 521 through a lowpass filter 523. It will be noted that the control circuit 522 corresponds to the combination of the limiter amplifiers 514, 515 and the multiplier 516 shown in FIG. 42, or the combination of the square-law circuits 517, 518 and the subtracter 519 shown in FIG. 43.

In the configuration shown in FIG. 42 or FIG. 43, there is a possibility that the phase adjustment by the voltage-controlled oscillator 502 will not completely cancel an amplitude error occurring between the constant-amplitude waves A and B, although the phase error can be eliminated completely by the voltage-controlled oscillator 502. In this case, the output wave kX contains a distortion component. The configuration shown in FIG. 45 is directed to eliminating such a distortion component. The distortion component extracted by the control circuit 52 is used for controlling not only the oscillation frequency of the voltage-controlled oscillator 502 but also the gain of the AGC amplifier 521 (amplitude of the constant-amplitude wave) so that the extracted distortion component is canceled. In this way, the configuration shown in FIG. 45 adjusts the phase and amplitude. It will be noted that the AGC amplifier 521 can be provided between the adder 501 and the limiter amplifier 504.

Figure 46:
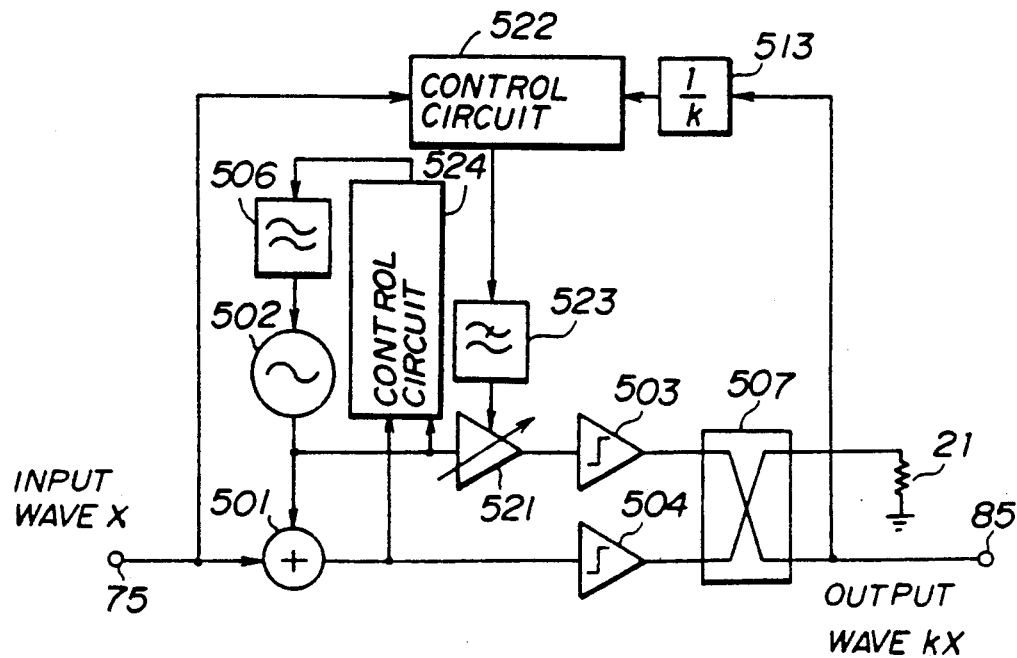
FIG. 46 is a block diagram illustrating a first variation of the configuration shown in FIG. 45.

FIG. 46 illustrates a first variation based on the principle of the configuration shown in FIG. 44. In FIG. 46, those parts which are the same as those shown in FIG. 45 are given the same reference numerals. The voltage-controlled oscillator 502 is controlled by a control circuit 524 provided separately from the control circuit 522. The control circuit 524 can be formed of, for example, the operation circuit 505 shown in FIG. 36. The control voltage applied to the voltage-controlled oscillator 502 is generated from the amplitude difference obtained by calculating $A^2-B^2$ by the control circuit 524. On the other hand, the control voltage applied to the AGC amplifier 521 is generated from the distortion component contained in the output wave kX by the control circuit 522.

Figures 47, 48:
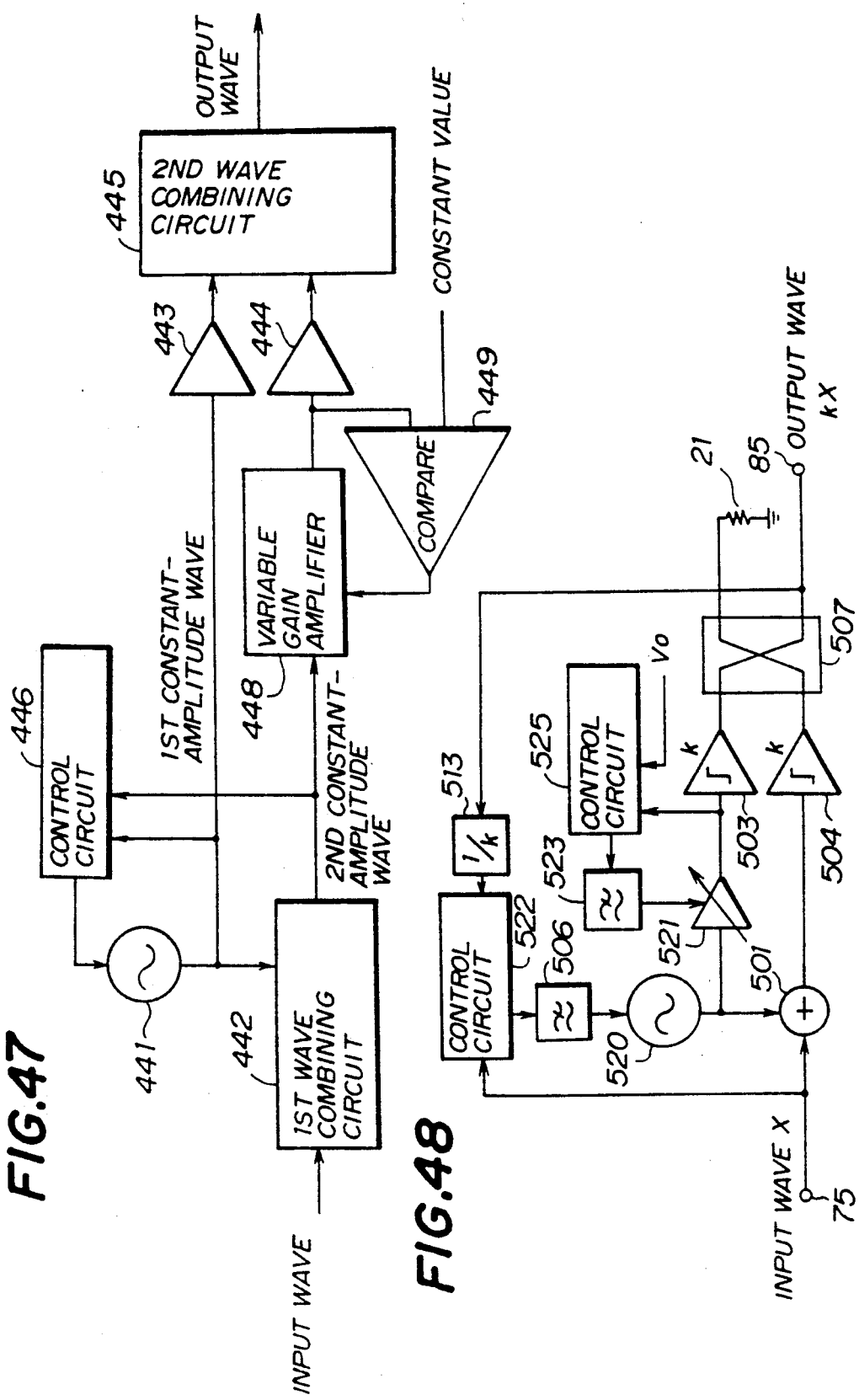
FIG. 47 is a block diagram illustrating an outline of a second variation of the configuration shown in FIG. 45.
FIG. 48 is a block diagram illustrating the configuration of the second variation shown in FIG. 47 in more detail.

FIG. 47 illustrates an outline of a second variation based on the principle of the configuration shown in FIG. 44. In FIG. 47, those parts which are the same as those shown in the previous figures are given the same reference numerals. The variable gain amplifier 448 is controlled by a comparator circuit 449, which compares the output signal of the variable gain amplifier 448 with a constant value.

FIG. 48 illustrates the configuration shown in FIG. 47 in more detail. In FIG. 48, those parts which are the same as those shown in FIG. 45 are given the same reference numerals. A control circuit 525 corresponds to the comparator circuit 449 shown in FIG. 47, and is configured as shown in FIG. 32. That is, the control circuit 525 is made up of two square-law circuits 338 and 340, the 1/k attenuator 327 and the subtracter 339. When the AGC amplifier 521 operates normally, the output thereof has a constant amplitude. This constant amplitude is determined to be a reference value Vo. The control circuit 525 controls the gain of the AGC amplifier 521 via the lowpass filter 521 so that the output of the AGC amplifier 521 is equal to the reference value Vo. With the above arrangement, cancel an amplitude error can be canceled.

The present invention is not limited to the specifically disclosed embodiments, and variations and modifications may be made without departing from the scope of the present invention.

What is claimed is:

1. A constant-amplitude wave combination type amplifier comprising:
   a first amplifier outputting a first amplified output;
   a second amplifier outputting a second amplified output;
   first constant-amplitude wave generating means, coupled to said first and second amplifiers, for combining an input wave and said second amplified output from said second amplifier to generate a first constant-amplitude wave which is input to said first amplifier;
   second constant-amplitude wave generating means, coupled to said first and second amplifiers, for combining said input wave and said first amplified output from said first amplifier to generate a second constant-amplitude wave; and
   first wave combining means, coupled to said first and second amplifiers, for combining said first and second amplified outputs and for generating an output wave,
   said first and second amplifiers being operated in a saturated area of operation.

2. A constant-amplitude wave combination type amplifier as claimed in claim 1, wherein:
   said first constant-amplitude wave generating means comprises a first attenuator which attenuates said second amplified output by a predetermined attenuation level, and a first adder having a first input terminal receiving said input wave, a second input terminal receiving said second amplified output which has passed through said first attenuator, and an output terminal which outputs said first constant-amplitude wave by adding said input wave and said second amplified output which has passed through said first attenuator;
   said second constant-amplitude wave generating means comprises a second attenuator which attenuates said first amplified output by a predetermined attenuation level, and a second adder having a first input terminal receiving said input wave, a second input terminal receiving said first amplified output which has passed through said second attenuator, and an output terminal which outputs said second constant-amplitude wave obtained by adding said input wave and said first amplified output which has passed through said second attenuator; and
   said first wave combining means comprises an in-phase hybrid circuit having a first input terminal receiving said first amplified output, a second input terminal receiving said second amplified output, and an output terminal which outputs said output wave.

3. A constant-amplitude wave combination type amplifier as claimed in claim 1 wherein:
   said first constant-amplitude generating means comprises a first attenuator which attenuates said second amplified output by a predetermined attenuation level, and an adder having a first input terminal receiving said input wave, a second input terminal receiving said second amplified output which passes through said first attenuator, and an output terminal which outputs said first constant-amplitude wave obtained by adding said input wave and said second amplified output which has passed through said first attenuator;
   said second constant-amplitude generating means comprises a second attenuator which attenuates said first amplified output by a predetermined attenuation level, and a subtracter having a first input terminal receiving said input wave, a second input terminal receiving said first amplified output which has passed through said second attenuator, and an output terminal which outputs said second constant-amplitude wave obtained by subtracting said input wave from said first amplified output which has passed through said second attenuator; and
   said first wave combining means comprises a 180°-out-of-phase hybrid circuit having a first input terminal receiving said first amplified output, a second input terminal receiving said second amplified output, and an output terminal which outputs an output wave.

4. A constant-amplitude wave combination type amplifier as claimed in claim 1, further comprising:
   a third amplifier amplifying said first constant-amplitude wave and generating a third amplified output;
   a fourth amplifier amplifying said second constant-amplitude wave and generating a fourth amplified output; and
   second wave combining means, coupled to said third and fourth amplifiers, for combining said third and fourth amplified outputs and for generating an output wave which is different from said output wave generated by said first wave combining means.

5. A constant-amplitude wave combination type amplifier as claimed in claim 1, further comprising:
   a third amplifier amplifying said first amplified output and generating a third amplified output;

a fourth amplifier amplifying said second amplified output and generating a fourth amplified output; and second wave combining means, coupled to said third and fourth amplifiers, for combining said third and fourth amplified outputs and for generating an output wave which is different from said output wave generated by said first wave combining means.

6. A constant-amplitude wave combination type amplifier comprising:

constant-amplitude wave generating means for combining an input wave and a first auxiliary input wave and for generating a first constant-amplitude wave and a second constant-amplitude wave;

a first amplifier amplifying said first constant-amplitude wave and outputting a first amplified output;

a second amplifier amplifying said second constant-amplitude wave and outputting a second amplified output;

first wave combining means, coupled to said first and second amplifiers, for combining said first and second amplified outputs and for generating an output wave and an auxiliary output wave; and auxiliary wave feedback means, coupled to said first wave combining means and said constant-amplitude wave generating means, for feeding back, as said first auxiliary input wave, said auxiliary output wave to said constant-amplitude wave generating means, said first and second amplifiers being operated in a saturated area of operation, and the first and second amplified outputs being fed back in phase to said first and second amplifiers, respectively, via said first wave combining means, said auxiliary wave feed back means and said constant-amplitude wave generating means.

7. A constant-amplitude wave combination type amplifier as claimed in claim 6, further comprising:

auxiliary wave generating means for generating a second auxiliary input wave from said input wave; and adder means, coupled to said auxiliary wave feedback means and said auxiliary wave generating means, for adding said first auxiliary input wave supplied from said auxiliary wave feedback means and said second auxiliary input wave generated by said auxiliary wave generating means and for outputting, as said first auxiliary input wave supplied to said constant-amplitude wave generating means, an addition result to said constant-amplitude wave generating means.

8. A constant-amplitude wave combination type amplifier as claimed in claim 7, wherein:

said auxiliary wave generating means comprises approximate solution circuit means for generating an approximate solution indicative of an amplitude of an orthogonal wave orthogonal to said input wave; and said approximate solution corresponds to said second auxiliary input wave generated by said auxiliary wave generating means.

9. A constant-amplitude wave combination type amplifier as claimed in claim 8, wherein said approximate solution circuit means comprises:

a limiter amplifier which amplifies said input wave and outputs an amplitude-limited wave;

a subtracter which outputs a difference between said input wave and said amplitude-limited wave; and said difference corresponds to said second auxiliary input wave generated by said auxiliary wave generating means.

10. A constant-amplitude wave combination type amplifier as claimed in claim 8, wherein:

said approximate solution circuit means comprises a first attenuator which has a first attenuation level and which outputs an attenuated approximate solution to said adder means;

said auxiliary wave feedback means comprises a second attenuator which has a second attenuation level and which outputs a first attenuated auxiliary output wave, a phase shifter which shifts the phase of said first attenuated auxiliary output wave by a predetermined angle, and a third attenuator which has a third attenuation level and which outputs a second attenuated auxiliary wave to said adder means; and the sum of said first attenuation level and said third attenuation level is equal to 1.

11. A constant-amplitude wave combination type amplifier as claimed in claim 6, wherein:

said constant-amplitude wave generating means comprises a first 90° hybrid circuit having a first input terminal receiving said input wave, a second input terminal receiving said first auxiliary input wave, a first output terminal outputting said first constant-amplitude wave to said first amplifier, and a second output terminal outputting said second constant-amplitude wave to said second amplifier;

said first wave combining means comprises a second 90° hybrid circuit having a first input terminal receiving said first amplified output, a second input terminal receiving said second amplified output, a first output terminal outputting said auxiliary output wave to said auxiliary wave feedback means, and a second output terminal which outputs said output wave; and said auxiliary wave feedback means comprises an attenuator which attenuates said auxiliary output wave by a predetermined attenuation level, and a phase shifter which shifts the phase of a wave from said attenuator by a predetermined angle and which outputs said first auxiliary input wave applied to said second input terminal of said first 90° hybrid circuit.

12. A constant-amplitude wave combination type amplifier as claimed in claim 6, further comprising:

a third amplifier amplifying said first constant-amplitude wave and generating a third amplified output;

a fourth amplifier amplifying said second constant-amplitude wave and generating a fourth amplified output; and second wave combining means, coupled to said third and fourth amplifiers, for combining said third and fourth amplified outputs and for generating an output wave which is different from said output wave generated by said first wave combining means.

13. A constant-amplitude wave combination type amplifier as claimed in claim 6, further comprising:

a third amplifier amplifying said first amplified output and generating a third amplified output;

a fourth amplifier amplifying said second amplified output and generating a fourth amplified output; and second wave combining means, coupled to said third and fourth amplifiers, for combining said third and fourth amplified outputs and for generating an output wave which is different from said output wave generated by said first wave combining means.

14. A constant-amplitude wave combination type amplifier comprising:

constant-amplitude wave generating means for combining an input wave and an auxiliary input wave and for generating a first constant-amplitude wave and a second constant-amplitude wave;

a first amplifier amplifying said first constant-amplitude wave and outputting a first amplified output;

a second amplifier amplifying said second constant-amplitude wave and outputting a second amplified output;

first wave combining means, coupled to said first and second amplifiers, for combining said first and second amplified outputs and for generating an output wave and an auxiliary output wave; and auxiliary wave generating means, coupled to said constant-amplitude wave generating means, for generating said auxiliary input wave from said input wave, said auxiliary wave generating means including a limiter amplifier coupled to a subtracter.

15. A constant-amplitude wave combination type amplifier as claimed in claim 14, further comprising correction means for generating a correction value indicative of a distortion component contained in said output wave by comparing said input wave with said output wave and for adding said correction value to said input value so that said distortion component contained in said output wave is canceled.

16. A constant-amplitude wave combination type amplifier as claimed in claim 15, wherein said correction means comprises:

an attenuator which attenuates said output wave by a predetermined attenuation level and which outputs an attenuated output wave;

a subtracter which outputs a difference signal indicative of a difference between said attenuated output wave and a corrected input wave; and an adder which adds said difference signal and said input wave and which outputs a corrected input wave corresponding to an addition result, said corrected input wave being supplied, as said input wave, to said constant-amplitude wave generating means, and said difference signal corresponding to said correction value.

17. A constant-amplitude wave combination type amplifier as claimed in claim 15, wherein said correction means comprises:

an attenuator which attenuates said output wave by a predetermined attenuation level and which outputs an attenuated output wave;

a subtracter which outputs a difference signal indicative of a difference between said attenuated output wave and said input wave;

a limiter amplifier which amplifies said difference signal and which outputs an amplified difference signal corresponding to said correction value; and an adder which adds said amplified difference signal and said input wave and which outputs said input wave having said amplified difference to said constant-amplitude wave generating means.

18. A constant-amplitude wave combination amplifier as claimed in claim 14, further comprising correction means, provided between said auxiliary wave generating means and said constant-amplitude wave generating means, for generating a correction value indicative of a distortion component contained in said output wave by comparing said auxiliary output wave with said auxiliary input wave and for adding said correction value to said auxiliary input wave, so that said auxiliary input wave to which said correction value has been added is supplied to said constant-amplitude wave generating means, and said distortion component contained in said output wave is canceled.

19. A constant-amplitude wave combination type amplifier as claimed in claim 18, wherein said correction means comprises:

an attenuator which attenuates said auxiliary output wave by a predetermined attenuation level and which outputs an attenuated auxiliary output wave;

a subtracter which outputs a difference signal indicative of a difference between said attenuated auxiliary output wave and a corrected input wave;

a limiter amplifier which amplifies said difference signal and which outputs an amplitude-limited difference signal corresponding to said correction value; and an adder which adds said auxiliary input wave and said amplitude-limited difference signal and which outputs said corrected input wave to said constant-amplitude wave generating means as said auxiliary input wave.

20. A constant-amplitude wave combination type amplifier as claimed in claim 18, wherein said correction means comprises:

an attenuator which attenuates said auxiliary output wave by a predetermined attenuation level and which outputs an attenuated auxiliary output wave;

a subtracter which outputs a difference signal indicative of a difference between said attenuated auxiliary output wave and said auxiliary input wave, said difference signal corresponding to said correction value; and an adder which adds said difference signal and said auxiliary input wave and which outputs said input wave having said difference to said constant-amplitude wave generating means.

21. A constant-amplitude wave combination type amplifier as claimed in claim 14, further comprising:

variable gain amplifier means, provided between said auxiliary wave generating means and said constant-amplitude wave generating means, for amplifying said auxiliary input wave by a gain and for outputting said auxiliary input wave having an amplified amplitude to said constant-amplitude wave generating means; and control means for generating a correction value indicative of a distortion component contained in said output wave by comparing said output wave with said input wave and for controlling the gain of said variable gain amplifier means on the basis of said correction value so that said distortion component contained in said output wave is canceled.

22. A constant-amplitude wave combination type amplifier as claimed in claim 21, wherein said control means comprises:

an attenuator which attenuates said output wave by a predetermined attenuation level and which outputs an attenuated output wave;

a first square-law circuit which squares said attenuated output wave and which outputs a squared attenuated output wave;

a second square-law circuit which squares said input wave and which outputs a squared input wave;

a subtracter which outputs a difference signal indicative of a difference between said squared attenuated output wave and said squared input wave; and a filter which extracts a D.C. component from said difference signal and which outputs said D.C. component to said variable gain amplifier means, and wherein said variable gain amplifier means comprises an automatic gain control amplifier having a variable gain controlled by said D.C. component.

23. A constant-amplitude wave combination type amplifier as claimed in claim 14, further comprising:

variable gain amplifier means, provided between said auxiliary wave generating means and said constant-amplitude wave generating means, for amplifying said auxiliary input wave by a gain and for outputting said auxiliary input wave having an amplified amplitude to said constant-amplitude wave generating means; and control means for generating a correction value indicative of a distortion component contained in said output wave by comparing said second constant-amplitude wave with a predetermined reference value and for controlling the gain of said variable gain amplifier means so that said distortion component contained in said output wave is canceled.

24. A constant-amplitude wave combination type amplifier as claimed in claim 23, wherein said control means comprises:

a square-law circuit which squares said second constant-amplitude wave and which outputs a squared signal;

a subtracter which outputs a difference signal indicative of a difference between said squared signal and said predetermined reference value; and a filter which extracts a D.C. component from said difference signal and which outputs said D.C. component to said variable gain amplifier means, and wherein said variable gain amplifier means comprises an automatic gain control amplifier having a variable gain controlled by said D.C. component.

25. A constant-amplitude wave combination type amplifier as claimed in claim 14, further comprising:

variable gain amplifier means, provided between said auxiliary wave generating means and said constant-amplitude wave generating means, for amplifying said auxiliary input wave by a gain and for outputting said auxiliary input wave having an amplified amplitude to said constant-amplitude wave generating means; and control means for generating a correction value indicative of a distortion component contained in said output wave by comparing said auxiliary output wave with said auxiliary input wave and for controlling the gain of said variable gain amplifier means so that said distortion component contained in said output wave is canceled.

26. A constant-amplitude wave combination type amplifier as claimed in claim 25, wherein said control means comprises:

an attenuator which attenuates said output wave by a predetermined attenuation level and which outputs an attenuated output wave;

a first square-law circuit which squares said attenuated output wave and which outputs a squared attenuated output wave;

a second square-law circuit which squares said auxiliary input wave and which outputs a squared auxiliary input wave;

a subtracter which outputs a difference signal indicative of a difference between said squared attenuated output wave and said squared auxiliary input wave; and a filter which extracts a D.C. component from said difference signal and which outputs said D.C. component to said variable gain amplifier means, and wherein said variable gain amplifier means comprises an automatic gain control amplifier having a variable gain controlled by said D.C. component.

27. A constant-amplitude wave combination type amplifier as claimed in claim 14, further comprising:

a third amplifier amplifying said first constant-amplitude wave and generating a third amplified output;

a fourth amplifier amplifying said second constant-amplitude wave and generating a fourth amplified output; and second wave combining means, coupled to said third and fourth amplifiers, for combining said third and fourth amplified outputs and for generating an output wave which is different from said output wave generated by said first wave combining means.

28. A constant-amplitude wave combination type amplifier as claimed in claim 14, wherein the limiter amplifier amplifies said input wave and outputs an amplitude-limited wave, wherein the subtracter outputs a difference between said input wave and said amplitude-limited wave, said difference corresponding to said auxiliary input wave generated by said auxiliary wave generating means, wherein said constant-amplitude wave generating means comprising a 90° hybrid circuit having a first input terminal receiving said input wave, a second input terminal receiving said auxiliary input wave, a first output terminal outputting said first constant-amplitude wave, and a second output terminal outputting said second constant-amplitude wave, and wherein said first wave combining means comprises a −90° hybrid circuit having a first input terminal receiving said first amplified output, a second input terminal receiving said second amplified output, a first output terminal outputting said output wave, and a second output terminal which is terminated via a resistor.

29. A constant-amplitude wave combination type amplifier as claimed in claim 14, wherein the limiter amplifier amplifies said input wave and outputs an amplitude-limited wave, wherein the subtracter outputs a difference between said input wave and said amplitude-limited wave, said difference corresponding to said auxiliary input wave generated by said auxiliary wave generating means, wherein said constant-amplitude wave combination type amplifier further comprises a 90° phase shifter which shifts a phase of said auxiliary input wave by 90° and which outputs said auxiliary input wave having a 90°-shifted phase to said constant-amplitude wave generating means, wherein said constant-amplitude wave generating means comprising an in-phase hybrid circuit having a first input terminal receiving said input wave, a second input terminal receiving said auxiliary input wave from said 90° phase shifter, a first output terminal outputting said first constant-amplitude wave, and a second output terminal outputting said second constant-amplitude wave, and wherein said first wave combining means comprises a 90° hybrid circuit having a first input terminal receiving said first amplified output, a second input terminal receiving said second amplified output, a first output terminal outputting said output wave, and a second terminal which outputs said auxiliary output wave.

30. A constant-amplitude wave combination type amplifier as claimed in claim 14, further comprising:
variable gain amplifier means, provided between said auxiliary wave generating means and said constant-amplitude wave generating means, for amplifying said auxiliary input wave by a gain and for outputting said auxiliary input wave having an amplified amplitude to said constant-amplitude wave generating means; and
control means for generating a correction value indicative of a distortion component contained in said output wave by comparing said first and second amplified outputs with a predetermined reference value and for controlling the gain of said variable gain amplifier means so that said distortion component contained in said output wave is canceled.

31. A constant-amplitude wave combination type amplifier as claimed in claim 14, further comprising:
a third amplifier amplifying said first amplified output and generating a third amplified output;
a fourth amplifier amplifying said second amplified output and generating a fourth amplified output; and
second wave combining means, coupled to said third and fourth amplifiers, for combining said third and fourth amplified outputs and for generating an output wave which is different from said output wave generated by said first wave combining means.

32. A constant-amplitude wave combination type amplifier comprising:
variable frequency generating means for generating a first constant-amplitude wave having a frequency controllable by a control signal;
first wave combining means, coupled to said variable frequency generating means, for combining an input wave and said first constant-amplitude wave and for generating a second constant-amplitude wave;
a first amplifier which amplifies said first constant-amplitude wave and which generates a first amplified output;
a second amplifier which amplifies said second constant-amplitude wave and which generates a second amplified output;
second wave combining means, coupled to said first and second amplifiers, for combining said first and second amplified outputs and for generating an output wave; and
first control means, coupled to said first combining means and said variable frequency generating means, for generating said control signal from said first and second constant-amplitude waves.

33. A constant-amplitude wave combination type amplifier as claimed in claim 32, further comprising:
variable gain amplifier means for amplifying said first constant-amplitude wave by a gain and for outputting an amplified wave to said first amplifier; and
second control means for generating a correction value indicative of a distortion component contained in said output wave by comparing said input wave with said output wave and for controlling the gain of said variable gain amplifier means on the basis of said correction value so that said distortion component contained in said output wave is canceled.

34. A constant-amplitude wave combination type amplifier as claimed in claim 32, further comprising:
variable gain amplifier means for amplifying said second constant-amplitude wave by a gain and for outputting an amplified wave to said second amplifier; and
second control means for generating a correction value indicative of a distortion component contained in said output wave by comparing said amplified wave with a predetermined constant value and for controlling the gain of said variable gain amplifier means on the basis of said correction value so that said distortion component contained in said output wave is canceled.

35. A constant-amplitude wave combination type amplifier as claimed in claim 32, wherein said first control means comprises:
operation means for calculating $A^2-B^2$ where A is an amplitude of said first constant-amplitude wave and B is an amplitude of said second constant-amplitude wave and for generating an operation output indicating $A^2-B^2$; and
a filter which extracts a D.C. component from said operation output and which outputs said D.C. component to said variable frequency generating means as said control signal, and
wherein said variable frequency generating means comprises a voltage-controlled oscillator controlled by said D.C. component.

36. A constant-amplitude wave combination type amplifier as claimed in claim 32, wherein said first control means comprises:
operation means for generating $A+B$ and $A-B$ from said first and second constant-amplitude waves where A is an amplitude of said first constant-amplitude wave and B is an amplitude of said second constant-amplitude wave;
multiplying means for multiplying $A+B$ by $A-B$ and for generating an operation output showing $A^2-B^2$; and
a filter extracting a D.C. component from said operation output and outputting said D.C. component to said variable frequency generating means as said control signal, and
wherein said variable frequency generating means comprises a voltage-controlled oscillator controlled by said D.C. component.

37. A constant-amplitude wave combination type amplifier comprising:
variable frequency generating means for generating a first constant-amplitude wave having a frequency controllable by a control signal;

first wave combining means, coupled to said variable frequency generating means, for combining an input wave and said first constant-amplitude wave and for generating a second constant-amplitude wave;

a first amplifier which amplifies said first constant-amplitude wave and which generates a first amplified output;

a second amplifier which amplifies said second constant-amplitude wave and which generates a second amplified output;

second wave combining means, coupled to said first and second amplifiers, for combining said first and second amplified outputs and for generating an output wave; and control means for generating said control signal from said input wave and said output wave.

38. A constant-amplitude wave combination type amplifier as claimed in claim 37, further comprising variable gain amplifier means for amplifying said first constant-amplitude wave by a gain corresponding to said control signal generated by said control means.

39. A constant-amplitude wave combination type amplifier as claimed in claim 38, wherein said control means comprises:

difference signal generating means for generating a difference signal indicative of a distortion component contained in said output wave from respectively said input wave and said output wave;

a first filter which extracts a first D.C. component from said difference signal and which outputs said first D.C. component to said variable frequency generating means as said control signal; and a second filter which extracts a second D.C. component from said difference signal and which outputs said second D.C. component to said variable gain amplifier means as said control signal.

40. A constant-amplitude wave combination type amplifier as claimed in claim 39, wherein said variable frequency generating means comprises a voltage-controlled oscillator controlled by said first D.C. component.

41. A constant-amplitude wave combination type amplifier as claimed in claim 39, wherein said variable gain amplifier means comprises an automatic gain control amplifier controlled by said second D.C. component.

42. A constant-amplitude wave combination type amplifier as claimed in claim 37, wherein said control means comprises:

an attenuator which attenuates said output wave by a predetermined attenuation level and which outputs an attenuated output wave;

a first limiter amplifier which amplifies said attenuated output wave and which outputs an amplified attenuated output wave;

a second limiter amplifier which amplifies said input wave and which outputs an amplified input wave;

multiplying means, coupled to said first and second limiter amplifiers, for multiplying said amplified input wave by said amplified attenuated output wave and for generating a difference signal indicative of a distortion component contained in said output wave; and a filter which extracts a D.C. component from said difference signal and which outputs said D.C. component to said variable frequency generating means as said control signal, wherein said variable frequency generating means comprises a voltage-controlled oscillator controlled by said D.C. component.

43. A constant-amplitude wave combination type amplifier as claimed in claim 37, wherein said control means comprises:

an attenuator which attenuates said output wave by a predetermined attenuation level and which outputs an attenuated output wave;

a first square-law circuit which squares said attenuated output wave and which outputs a first squared signal;

a second square-law circuit which squares said input wave and which outputs a second squared signal;

a subtracter which outputs a difference signal indicative of a difference between said first and second squared signals; and a filter which extracts a D.C. component from said difference signal and which outputs said D.C. component to said variable frequency generating means as said control signal, and said variable frequency generating means comprises a voltage-controlled oscillator controlled by said D.C. component.

44. A constant-amplitude wave combination type amplifier as claimed in claim 37, further comprising variable gain amplifier means for amplifying said second constant-amplitude wave by a gain corresponding to said control signal generated by said control means.

* * * * *

UNITED STATES PATENT AND TRADEMARK OFFICE
CERTIFICATE OF CORRECTION

PATENT NO. : 5,287,069
DATED : February 15, 1994
INVENTOR(S) : Naofumi OKUBO et al.

It is certified that error appears in the above-indentified patent and that said Letters Patent is hereby corrected as shown below:

Column 3, line 19, change "said" to --second--.

Column 17, line 54, change "41" to --441--.

Column 20, line 51, change "52" to --522--.

Signed and Sealed this

Fourth Day of October, 1994

BRUCE LEHMAN

*Attest:*

*Attesting Officer*     *Commissioner of Patents and Trademarks*